United States Patent
Kanno

(10) Patent No.: US 9,948,146 B2
(45) Date of Patent: Apr. 17, 2018

(54) VARIABLE CAPACITANCE CIRCUIT, VARIABLE CAPACITANCE DEVICE, RESONANT CIRCUIT, AMPLIFYING CIRCUIT, AND ELECTRONIC APPARATUS

(71) Applicant: Dexerials Corporation, Shinagawa-ku, Tokyo (JP)

(72) Inventor: Masayoshi Kanno, Utsunomiya (JP)

(73) Assignee: Dexerials Corporation, Shinagawa-ku, Tokyo (JP)

( * ) Notice: Subject to any disclaimer, the term of this patent is extended or adjusted under 35 U.S.C. 154(b) by 281 days.

(21) Appl. No.: 14/769,209

(22) PCT Filed: Feb. 7, 2014

(86) PCT No.: PCT/JP2014/052839
§ 371 (c)(1),
(2) Date: Aug. 20, 2015

(87) PCT Pub. No.: WO2014/129317
PCT Pub. Date: Aug. 28, 2014

(65) Prior Publication Data
US 2016/0006262 A1 Jan. 7, 2016
US 2017/0155251 A9 Jun. 1, 2017

(30) Foreign Application Priority Data

Feb. 22, 2013 (JP) ................................. 2013-033218

(51) Int. Cl.
*H01F 27/42* (2006.01)
*H02J 50/12* (2016.01)
(Continued)

(52) U.S. Cl.
CPC .............. *H02J 50/12* (2016.02); *H02J 5/005* (2013.01); *H03H 7/38* (2013.01); *H04B 1/0458* (2013.01); *H01G 7/06* (2013.01); *H02J 17/00* (2013.01)

(58) Field of Classification Search
None
See application file for complete search history.

(56) References Cited

U.S. PATENT DOCUMENTS

2016/0141883 A1* 5/2016 Kanno ...................... H03J 3/20
307/104

FOREIGN PATENT DOCUMENTS

JP 2008-199306 A 8/2008
JP 2008-211064 A 9/2008
(Continued)

OTHER PUBLICATIONS

Apr. 22, 2014 International Search Report issued in International Patent Application No. PCT/JP2014/052839.

*Primary Examiner* — Cassandra Cox
(74) *Attorney, Agent, or Firm* — Kenja IP Law PC

(57) ABSTRACT

Provides is a variable capacitance circuit that is capable of efficiency optimizing antenna transmission effectively by regulating capacitance values of variable capacitance capacitors with use of direct current voltages applied to the variable capacitance capacitors. A variable capacitance circuit (1) includes a series variable capacitance element (2) and a parallel variable capacitance element (4) connected in series with the series variable capacitance element (2). The series variable capacitance element (2) includes two variable capacitance capacitors (CS1, CS2) (2a, 2b) connected in series. The parallel variable capacitance element (4) includes two variable capacitance capacitors (CP1, CP2) (4a, 4b) connected in series and a variable capacitance capacitor (CP3)(6) connected in parallel with the variable (Continued)

capacitance capacitors (CP1, CP2) (4a, 4b). The variable capacitance circuit (1) further includes three direct current terminals (7a, 7b, 7c).

25 Claims, 14 Drawing Sheets

(51) Int. Cl.
*H04B 1/04* (2006.01)
*H03H 7/38* (2006.01)
*H02J 5/00* (2016.01)
*H01G 7/06* (2006.01)
*H02J 17/00* (2006.01)

(56) References Cited

FOREIGN PATENT DOCUMENTS

| | | |
|---|---|---|
| JP | 2008-259269 A | 10/2008 |
| JP | 2011-138544 A | 7/2011 |
| JP | 2012-209749 A | 10/2012 |
| WO | 2011/013658 A1 | 2/2011 |

* cited by examiner

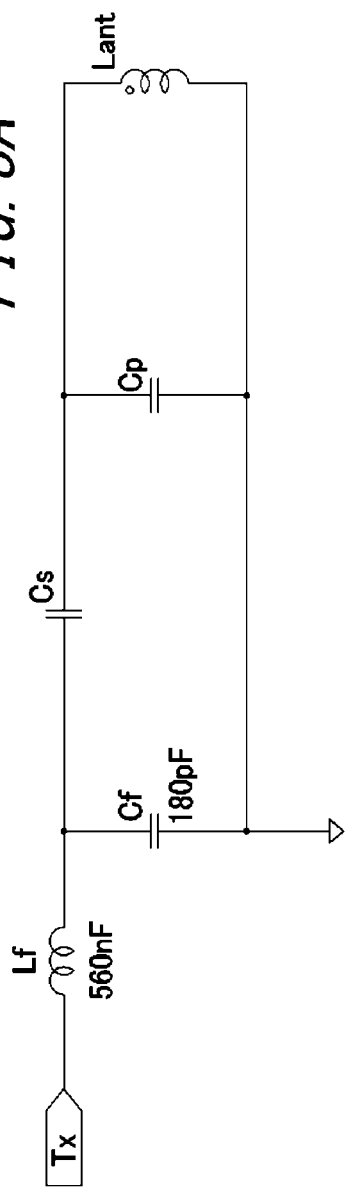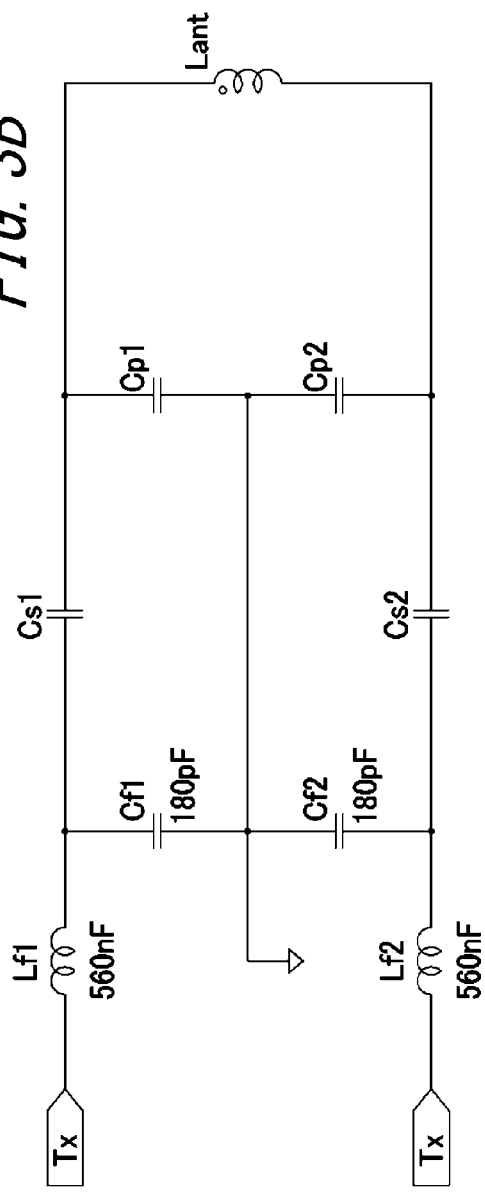

VARIABLE CAPACITANCE CIRCUIT, VARIABLE CAPACITANCE DEVICE, RESONANT CIRCUIT, AMPLIFYING CIRCUIT, AND ELECTRONIC APPARATUS

TECHNICAL FIELD

The present disclosure relates to a variable capacitance circuit, a variable capacitance device, a resonant circuit, an amplifying circuit and an electronic apparatuses including these circuits all of which use a plurality of variable capacitance capacitors. The present disclosure is based on and claims the priority of JP2013033218A filed in Japan on Feb. 22, 2013, which is herein incorporated by reference.

BACKGROUND

In recent years, contactless communication technologies have been established for exchanging signals through electromagnetic induction and are expanding their applications in transportation tickets and electronic money. Such a contactless communication function is more and more applied to mobile phones and is promising for future development. Not to mention Near Field Communication (NFC) through electromagnetic induction, IC tags with reading/writing distances of several meters have been also introduced into the market of logistics. Since allowing not only contactless communication but also simultaneous power transfer, the contactless communication technology may be used even in an IC card that itself does not have a power source such as a battery.

Besides, due to the specification, such as Qi, for contactless charging of a portable terminal apparatus, the power transfer technology of establishing inductive coupling or magnetic resonance between a charging device (a power transmitter) and a power-receiving device (a power receiver) through antenna coils included in these devices is gradually becoming popular.

In a system using such contactless communication (or contactless charging), resonant capacitors are connected to the loop antennas for communication and power transfer between a reader/writer (a charging device) and a contactless data carrier (or a power-receiving device). Furthermore, tuning a resonant frequency, which is determined by constants L and C of the loop antennas and the resonant capacitors, to a prescribed frequency of the system allows stable communication and power transfer, as well as maximization of a distance, between the reader/writer and the contactless data carrier.

However, the constants L and C of the loop antennas and the resonant capacitors are subject to several variable factors and are not always predictable. For example, a contactless data carrier or a power-receiving device may include a loop antenna made from copper foil patterns as a cost-reduction measure, and the L value varies due to a change in pattern width. As a cost-reduction measure, a resonant capacitor may also have copper foil of an antenna substrate configured to serve as electrodes and a resin of the substrate configured to serve as a dielectric, and the capacitance value changes depending on the width, the length, and interval of the copper foil piece. In the case of an IC card, since upper and lower sides of the IC card are ultimately laminated by protective films, the capacitor's capacitance is subject to an even greater variation due to the influence of the protective films. This raises the need for additional man-hours for, for example, regulating the capacitance value of the resonant capacitor by regulating an electrode area by trimming the copper foil pattern, as anticipative regulation in expectation of a frequency shift following the lamination.

When the resonant frequency is shifted due to the aforementioned various factors, the communication status might be unstabilized, and the communication distance might be reduced. One proposed method to address the problems is to regulate, in an antenna module including an antenna coil through which a magnetic flux from a reader/writer passes and a resonant circuit that efficiently converts a change in the magnetic flux into voltage, the resonant frequency by regulating the capacitance of a resonant capacitor in order to stabilize communication.

A contactless data carrier and a contactless chargeable power-receiving device, including an IC card, are often used in an apparatus targeted at portability as described above, and therefore, more compact and thinner resonant capacitors and loop antennas are strongly demanded. Furthermore, the trend of modulization of readers/writers and charging devices will even increase the need for miniaturization and thinning.

Incidentally, a ferroelectric thin film capacitor using a ferroelectric thin film of barium titanate or the like has a high dielectric constant per unit area and is suited for miniaturization and thinning, and accordingly, is being considered as a candidate for the above applications. However, the ferroelectric thin film capacitor still suffers from the problem of a large initial variation in the capacitance value and a large dependency of the capacitance value on temperature. The ferroelectric thin film capacitor is expected to find a wider range of applications if the above problem is attempted to be corrected also by the apparatus.

CITATION LIST

Patent Literature

PTL 1: JP2008211064A

SUMMARY

Technical Problem

As described above, in response to the trend of miniaturization and increased functionality of electronic apparatuses, it is necessary, when using a ferroelectric thin film capacitor suited for miniaturization and thinning in a resonant circuit of an antenna, to prevent the initial variation and temperature fluctuation in the capacitance value. On the other hand, the ferroelectric thin film capacitor is known to be highly bias-dependent and have a capacitance value that greatly changes in response to a bias voltage applied across the electrodes, and such variable capacitance characteristics have been exploited for resonant circuit purposes, as disclosed in Patent Literature 1. Nevertheless, Patent Literature 1 does not disclose how to control the bias voltage applied to the ferroelectric thin film capacitor and how and which parameters are to be regulated in order to regulate the characteristics of the resonant circuit of the antenna. Furthermore, since, as described earlier, the ferroelectric thin film capacitor has the large initial variation in the capacitance value, and moreover, may be affected by variation in conditions such as manufacturing tolerance in capacitance of the antenna circuit, temperature in use, and the communication distance, there is a problem that posterior regulation of the resonant frequency is not sufficient enough to optimize the characteristics of the circuit.

In view of the above, the present disclosure is to provide a variable capacitance circuit, a resonant circuit, an amplifying circuit and an electronic apparatus using these circuits all of which are capable of optimizing transmission efficiency of an antenna by regulating the capacitance value with use of direct current voltages applied to the variable capacitance capacitors each having a capacitance that changes in response to the direct current voltage applied across the corresponding terminals.

Solution to Problem

In one aspect for solving the aforementioned problem, at least one embodiment of the present disclosure provides a variable capacitance circuit, including: a first variable capacitance element including one or more variable capacitance capacitors and having a first combined capacitance value; a second variable capacitance element including one or more variable capacitance capacitors and having a second combined capacitance value; a first to a third alternate current terminal through which alternate current signals are inputted and outputted to and from the first and the second variable capacitance element; and a first to a third direct current terminal connected to the first and the second variable capacitance element so that direct current voltages are applied to the first and the second variable capacitance element. The first combined capacitance value changes in response to direct current voltages applied to the first and the second direct current terminal, the second combined capacitance value changes in response to direct current voltages applied to the second and the third direct current terminal, and the change in the first combined capacitance value and the change in the second combined capacitance value are opposite in direction.

In another aspect, at least one embodiment of the present disclosure provides a variable capacitance circuit, including: a first variable capacitance element including one or more variable capacitance capacitors and having a first combined capacitance value; a second variable capacitance element including one or more variable capacitance capacitors and having a second combined capacitance value; a third variable capacitance element including one or more variable capacitance capacitors and having a third combined capacitance value; a fourth variable capacitance element including one or more variable capacitance capacitors and having a fourth combined capacitance value; a first to a fifth alternate current terminal through which alternate current signals are inputted and outputted to and from the first to the fourth variable capacitance element; and a first to a third direct current terminal connected to the first to the fourth variable capacitance element so that direct current voltages are applied to the first to the fourth variable capacitance element. The first and the second variable capacitance element are connected in series between the first alternate current terminal and the third alternate current terminal, the second alternate current terminal is connected to a series connection node between the first variable capacitance element and the second variable capacitance element, the third and the fourth variable capacitance element are connected in series between the fourth alternate current terminal and the third alternate current terminal, and the fifth alternate current terminal is connected to a series connection node between the third variable capacitance element and the fourth variable capacitance element. The first and the third combined capacitance value each change in response to direct current voltages applied to the first and the second direct current terminal, and the second and the fourth combined capacitance value each change in response to direct current voltages applied to the second and the third direct current terminal. Furthermore, the first combined capacitance value is equal to the third combined capacitance value, and the second combined capacitance value is equal to the fourth combined capacitance value. Moreover, the change in the first combined capacitance value and the change in the second combined capacitance value are opposite in direction, and the change in the third combined capacitance value and the change in the fourth combined capacitance value are opposite in direction.

In yet another aspect, at least one embodiment of the present disclosure provides a variable capacitance device, including: a first variable capacitance element including one or more variable capacitance capacitors and having a first combined capacitance value; a second variable capacitance element including one or more variable capacitance capacitors and having a second combined capacitance value; a first to a third alternate current terminal through which alternate current signals are inputted and outputted to and from the first and the second variable capacitance element; and a first to a third direct current terminal connected to the first and the second variable capacitance element so that direct current voltages are applied to the first and the second variable capacitance element. The first combined capacitance value changes in response to direct current voltages applied to the first and the second direct current terminal, the second combined capacitance value changes in response to direct current voltages applied to the second and the third direct current terminal, and the change in the first combined capacitance value and the change in the second combined capacitance value are opposite in direction.

In yet another aspect, at least one embodiment of the present disclosure provides a variable capacitance device, including: a first variable capacitance element including one or more variable capacitance capacitors and having a first combined capacitance value; a second variable capacitance element including one or more variable capacitance capacitors and having a second combined capacitance value; a third variable capacitance element including one or more variable capacitance capacitors and having a third combined capacitance value; a fourth variable capacitance element including one or more variable capacitance capacitors and having a fourth combined capacitance value; a first to a fifth alternate current terminal through which alternate current signals are inputted and outputted to and from the first to the fourth variable capacitance element; and a first to a third direct current terminal connected to the first to the fourth variable capacitance element so that direct current voltages are applied to the first to the fourth variable capacitance element. The first and the second variable capacitance element are connected in series between the first alternate current terminal and the third alternate current terminal, and the second alternate current terminal is connected to a series connection node between the first variable capacitance element and the second variable capacitance element, the third and the fourth variable capacitance element are connected in series between the fourth alternate current terminal and the third alternate current terminal, and the fifth alternate current terminal is connected to a series connection node between the third variable capacitance element and the fourth variable capacitance element. The first and the third combined capacitance value each change in response to direct current voltages applied to the first and the second direct current terminal, and the second and the fourth combined capacitance value each change in response to direct current voltages applied to the second and the third direct current terminal. Furthermore, the first combined capacitance value is equal to the third combined capacitance value, and the second combined capacitance value is equal to the fourth combined capacitance value. Moreover, the change in the first combined capacitance value and the change in the second combined capacitance value are opposite in direction, and the change in the third combined capacitance value and the change in the fourth combined capacitance value are opposite in direction.

In yet another aspect, at least one embodiment of the present disclosure provides a resonant circuit, including: a variable capacitance circuit that includes a first variable capacitance element including one or more variable capacitance capacitors and having a first combined capacitance value, a second variable capacitance element including one or more variable capacitance capacitors and having a second combined capacitance value, a first to a third alternate current terminal through which alternate current signals are inputted and outputted to and from the first and the second variable capacitance element, and a first to a third direct current terminal connected to the first and the second variable capacitance element so that direct current voltages are applied to the first and the second variable capacitance element; and a coil connected to the variable capacitance circuit. In the variable capacitance circuit, the first combined capacitance value changes in response to direct current voltages applied to the first and the second direct current terminal, and the second combined capacitance value changes in response to direct current voltages applied to the second and the third direct current terminal. Furthermore, the change in the first combined capacitance value and the change in the second combined capacitance value are opposite in direction.

In yet another aspect, at least one embodiment of the present disclosure provides a resonant circuit, including: a variable capacitance circuit that includes a first variable capacitance element including one or more variable capacitance capacitors and having a first combined capacitance value, a second variable capacitance element including one or more variable capacitance capacitors and having a second combined capacitance value, a third variable capacitance element including one or more variable capacitance capacitors and having a third combined capacitance value, a fourth variable capacitance element including one or more variable capacitance capacitors and having a fourth combined capacitance value, a first to a fifth alternate current terminal through which alternate current signals are inputted and outputted to and from the first to the fourth variable capacitance element, and a first to a third direct current terminal connected to the first to the fourth variable capacitance element so that direct current voltages are applied to the first to the fourth variable capacitance element; and a coil connected to the variable capacitance circuit. In the variable capacitance circuit, the first and the second variable capacitance element are connected in series between the first alternate current terminal and the third alternate current terminal, and the second alternate current terminal is connected to a series connection node between the first variable capacitance element and the second variable capacitance element, and the third and the fourth variable capacitance element are connected in series between the fourth alternate current terminal and the third alternate current terminal, and the fifth alternate current terminal is connected to a series connection node between the third variable capacitance element and the fourth variable capacitance element. Furthermore, the coil has one end that is connected to the second alternate current terminal and another end that is connected to the fifth alternate current terminal. Moreover, the first and the third combined capacitance value each change in response to direct current voltages applied to the first and the second direct current terminal, the second and the fourth combined capacitance value each change in response to direct current voltages applied to the second and the third direct current terminal, the first combined capacitance value is equal to the third combined capacitance value, and the second combined capacitance value is equal to the fourth combined capacitance value. The change in the first combined capacitance value and the change in the second combined capacitance value are opposite in direction, and the change in the third combined capacitance value and the change in the fourth combined capacitance value are opposite in direction.

In yet another aspect, at least one embodiment of the present disclosure provides an amplifying circuit, including: a variable capacitance circuit that includes a first variable capacitance element including one or more variable capacitance capacitors and having a first combined capacitance value, a second variable capacitance element including one or more variable capacitance capacitors and having a second combined capacitance value, a first to a third alternate current terminal through which alternate current signals are inputted and outputted to and from the first and the second variable capacitance element, and a first to a third direct current terminal connected to the first and the second variable capacitance element so that direct current voltages are applied to the first and the second variable capacitance element; and an amplifier connected to the variable capacitance circuit. The second alternate current terminal is connected to a series connection node between the first variable capacitance element and the second variable capacitance element. Furthermore, the first combined capacitance value changes in response to direct current voltages applied to the first and the second direct current terminal, and the second combined capacitance value changes in response to direct current voltages applied to the second and the third direct current terminal. Moreover, the change in the first combined capacitance value and the change in the second combined capacitance value are opposite in direction.

In yet another aspect, at least one embodiment of the present disclosure provides an electronic apparatus, includes: a variable capacitance circuit that includes a first variable capacitance element including one or more variable capacitance capacitors and having a first combined capacitance value, a second variable capacitance element including one or more variable capacitance capacitors and having a second combined capacitance value, a first to a third alternate current terminal through which alternate current signals are inputted and outputted to and from the first and the second variable capacitance element, and a first to a third direct current terminal connected to the first and the second variable capacitance element so that direct current voltages are applied to the first and the second variable capacitance element. In the variable capacitance circuit, the first combined capacitance value changes in response to direct current voltages applied to the first and the second direct current terminal, and the second combined capacitance value changes in response to direct current voltages applied to the second and the third direct current terminal. Furthermore, the change in the first combined capacitance value and the change in the second combined capacitance value are opposite in direction.

In yet another aspect, at least one embodiment of the present disclosure provides an electronic apparatus, including: a variable capacitance circuit that includes a first variable capacitance element including one or more variable capacitance capacitors and having a first combined capacitance value, a second variable capacitance element including one or more variable capacitance capacitors and having a second combined capacitance value, a third variable capacitance element including one or more variable capacitance capacitors and having a third combined capacitance value, a fourth variable capacitance element including one or more variable capacitance capacitors and having a fourth combined capacitance value, a first to a fifth alternate current terminal through which alternate current signals are inputted and outputted to and from the first to the fourth variable capacitance element, and a first to a third direct current terminal connected to the first to the fourth variable capacitance element so that direct current voltages are applied to the first to the fourth variable capacitance element. In the variable capacitance circuit, the first and the second variable capacitance element are connected in series between the first alternate current terminal and the third alternate current terminal, the second alternate current terminal is connected to a series connection node between the first variable capacitance element and the second variable capacitance element, the third and the fourth variable capacitance element are connected in series between the fourth alternate current terminal and the third alternate current terminal, and the fifth alternate current terminal is connected to a series connection node between the third variable capacitance element and the fourth variable capacitance element. Furthermore, the first and the third combined capacitance value each change in response to direct current voltages applied to the first and the second direct current terminal, and the second and the fourth combined capacitance value each change in response to direct current voltages applied to the second and the third direct current terminal. Moreover, the first combined capacitance value is equal to the third combined capacitance value, and the second combined capacitance value is equal to the fourth combined capacitance value. The change in the first combined capacitance value and the change in the second combined capacitance value are opposite in direction, and the change in the third combined capacitance value and the change in the fourth combined capacitance value are opposite in direction.

Advantageous Effect

The variable capacitance circuit according to the present disclosure includes the first to the third direct current terminal, and is capable of changing the first combined capacitance value in response to the direct current voltages applied to the first and the second direct current terminal and is also capable of changing the second combined capacitance value in response to the direct current voltages applied to the second and the third direct current terminal, the change in the first combined capacitance value and the change in the second combined capacitance value being opposite in direction. Accordingly, the variable capacitance circuit according to the present disclosure allows a more thorough regulation of the capacitance values and also allows, when being used in the resonant circuit, a more thorough regulation of the impedance.

BRIEF DESCRIPTION OF THE DRAWINGS

In the accompanying drawings:

FIG. 3A is a circuit diagram illustrating an exemplary configuration of an unbalanced series-parallel resonant circuit including a series resonant capacitor connected in series with a resonant coil and a parallel resonant capacitor connected in parallel with the resonant capacitor, and FIG. 3B is a circuit diagram illustrating an exemplary configuration of a balanced series-parallel resonant circuit including series resonant capacitors connected in series with a resonant coil and parallel resonant capacitors connected in parallel with the resonant capacitor;

DETAILED DESCRIPTION

Preferred embodiments according to the present disclosure will be described in detail below with reference to the drawings. However, the present disclosure is not limited to the following embodiments. Needless to say, various changes may be made to the embodiments without departing from the gist of the present disclosure. The description is given in the following order.

Figure 1:
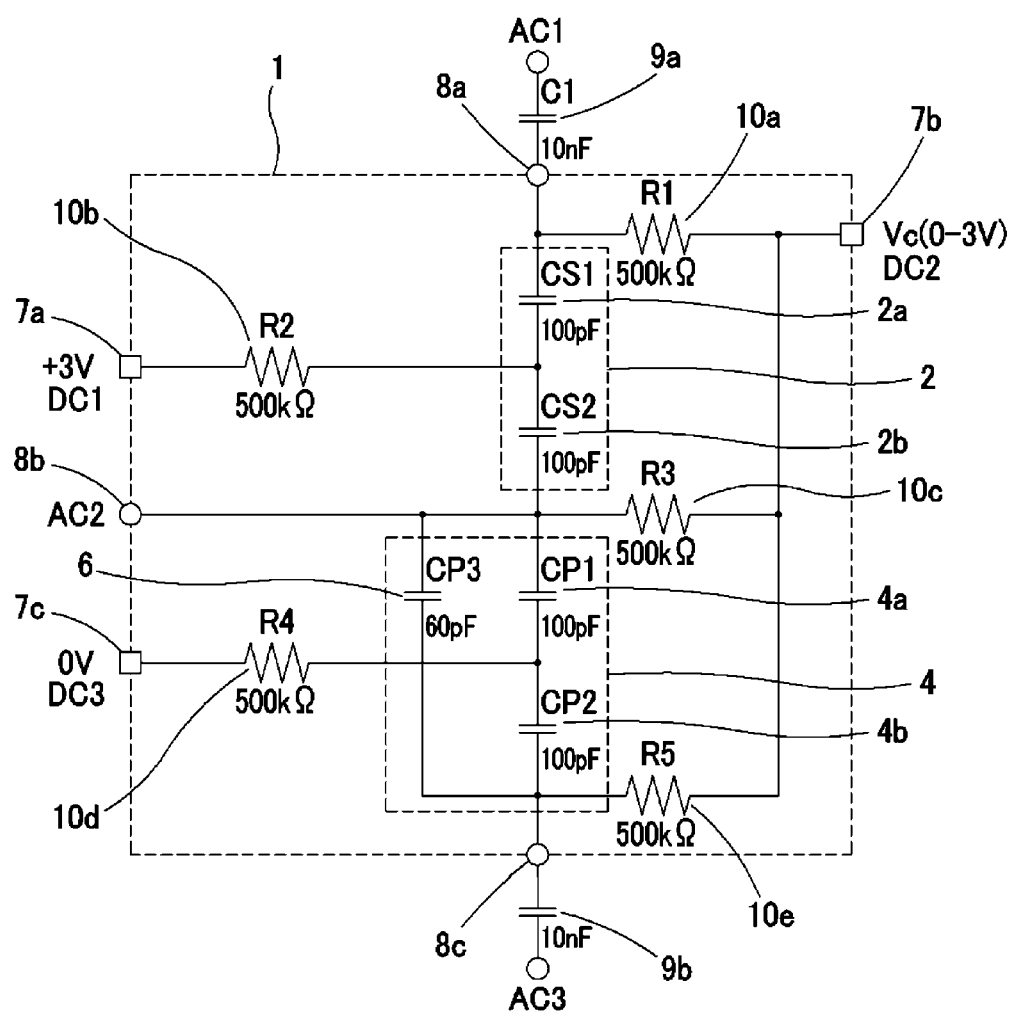
FIG. 1 is a circuit diagram illustrating an exemplary configuration of a variable capacitance circuit according to at least one embodiment of the present disclosure.

1. Circuit Configuration
1-1. Exemplary Configuration of Variable Capacitance Circuit
1-2. Exemplary Configuration of Resonant Circuit
2. Principle of Operation and Operation of Circuit
2-1. Principle of Operation of Variable Capacitance Circuit and Resonant Circuit
2-2. Operation of Variable Capacitance Circuit and Resonant Circuit
(1) Modification 1
(2) Modification 2 (Balanced Circuit)
(3) Modification 3 (Amplifying Circuit)
3. Exemplary Variable Capacitance Devices
4. Exemplary Contactless Communication Device
5. Exemplary Contactless Charging Device
1. Circuit Configuration
1-1. Exemplary Configuration of Variable Capacitance Circuit As illustrated in FIG. 1, a variable capacitance circuit 1 according to at least one embodiment of the present disclosure includes a series variable capacitance element 2 and a parallel variable capacitance element 4 connected in series with the series variable capacitance element 2. The series variable capacitance element 2 includes two variable capacitance capacitors (CS1, CS2) 2a, 2b connected in series. The parallel variable capacitance element 4 includes two variable capacitance capacitors (CP1, CP2) 4a, 4b connected in series and a variable capacitance capacitor (CP3) 6 connected in parallel with the variable capacitance capacitors (CP1, CP2) 4a, 4b.

The serially connected series variable capacitance element 2 and parallel variable capacitance element 4 have one end and the other end that form an alternate current terminal (AC1) 8a and an alternate current terminal (AC3) 8c through which alternate signals are inputted/outputted through a direct current cut-off capacitor (C1) 9a and a direct current cut-off capacitor (C2) 9b, respectively. An alternate current terminal (AC2) 8b is connected to a connection node between the series variable capacitance element 2 and the parallel variable capacitance element 4.

The variable capacitance circuit 1 includes three direct current terminals 7a, 7b, and 7c. The direct current terminal 7a is connected to a connection node between the variable capacitance capacitor (CS1) 2a and the variable capacitance capacitor (CS2) 2b through a direct current bias resistance (R2) 10b. The direct current terminal 7b is connected to the alternate current terminal (AC1) 8a through a direct current bias resistance (R1) 10a, to the connection node between the series variable capacitance element 2 and the parallel variable capacitance element 4 through a direct current bias resistance (R3) 10c, and to the alternate current terminal 8c through a direct current bias resistance (R5) 10e. The direct current terminal 7c is connected to a connection node between the variable capacitance capacitor (CP1) 4a and the variable capacitance capacitor (CP2) 4b through a direct current bias resistance (R4) 10d. The direct current terminal 7c is connected to the direct current ground potential (0 V), and a fixed direct current voltage (+3V) is inputted across the direct current terminal 7a and the direct current terminal 7c. A variable direct current voltage (Vc) that varies between the direct current terminal 7a and the direct current terminal 7c is inputted to the direct current terminal 7b.

1-2. Exemplary Configuration of Resonant Circuit

Figure 2:
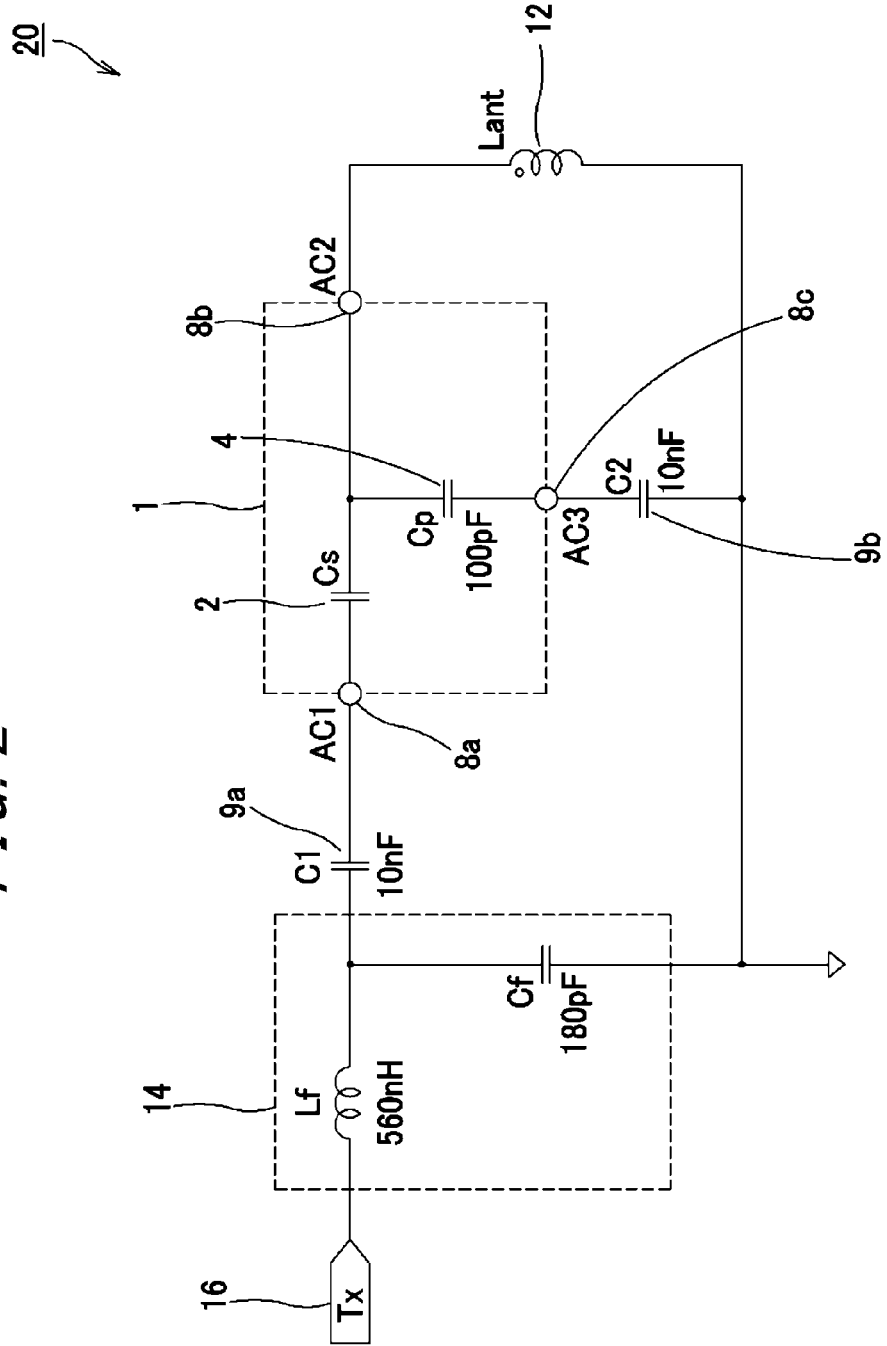
FIG. 2 is a circuit diagram illustrating an exemplary configuration of a resonant circuit according to at least one embodiment of the present disclosure.

As illustrated in FIG. 2, a resonant circuit 20 according to at least one embodiment of the present disclosure includes the variable capacitance circuit 1, which includes the series variable capacitance element (CS) 2 and the parallel variable capacitance element (CP) 4, and a coil 12, which is connected in series with the series variable capacitance element 2 and is also connected in parallel with the parallel variable capacitance element 4.

Furthermore, a filter circuit 14 may be connected to the alternate current terminal (AC1) 8a of the variable capacitance circuit 1 through the direct current cut-off capacitor (C1) 9a. The circuit 14 is preferably an LC filter which includes a filter capacitor (Cf), which is connected in parallel with the variable capacitance circuit 1, and an inductor Lf, which is connected at one end in series with the variable capacitance circuit 1 and is also connected at another end with a transmission signal terminal (Tx) 16.

With the three direct current terminals 7a, 7b, and 7c included in the variable capacitance circuit 1, the resonant circuit 20 is capable of applying a direct current voltage to each of the series variable capacitance element 2 and the parallel variable capacitance element 4 to change the capacitance value.

2. Principle of Operation and Operation of Circuit
2-1. Principle of Operation of Variable Capacitance Circuit and Resonant Circuit As illustrated in FIG. 3A, a resonant circuit of a transmitting/receiving antenna used for contactless communication or contactless charging includes a series capacitor CS, which is connected in series with an antenna coil Lant, and a parallel capacitor CP, which is connected in parallel with the antenna coil Lant. Preferably, an LC filter is connected to an input side of the resonant circuit, and a transmission signal Tx is inputted to the resonant circuit through the LC filter.

The resonant circuit of the antenna used for contactless communication is not limited to the aforementioned unbalanced resonant circuit and may have a balanced circuit configuration as illustrated in FIG. 3B. The balanced resonant circuit includes the antenna coil Lant connected to a connection node between a series capacitor CS1 and a parallel capacitor CP1 and to a connection node between a series capacitor CS2 and a parallel capacitor CP2. Preferably, an LC filter is connected to an input side of the resonant circuit, and transmission/reception signals Tx1, Tx2 are inputted through the LC filter. Whether unbalanced or balanced, these resonant circuits operate and function in the same way, and therefore, a description is given below solely of the unbalanced resonant circuit.

In such a resonant circuit, the resonant frequency is determined by the capacitance value of the series capacitor CS, the capacitance value of the parallel capacitor CP, and the inductance value of the antenna coil Lant. Accordingly, changing these values allows regulation of the resonant frequency. Furthermore, an impedance of the resonant circuit is determined by the capacitance value of the series capacitor CS, the capacitance value of the parallel capacitor CP, and the inductance value of the antenna coil Lant. Accordingly, changing these values not only changes the resonant frequency but also changes impedance.

Generally, when a resonant frequency is set to be resonant at 13.56 MHz, which is the carrier frequency employed in a reader/writer mode in a contactless communication system, the impedance is determined based on a desired antenna current and is often set to be in the range from 30 to 80Ω. At this time, as the resonant frequency is changed in response to a change in the capacitance values etc., the impedance is also changed.

In the previous patent application (JP2011197569A), the present inventor has proposed the technology of regulating the resonant frequency in a resonant circuit including a series capacitor connected in series with an antenna coil and a parallel capacitor connected in parallel with the antenna coil, by changing the capacitance value with use of a variable direct current bias voltage by using a variable capacitance capacitor as one of the series capacitor and the parallel capacitor.

Then, the present inventor has conducted an earnest study and found that the communication status is improved by optimally regulating the resonant impedance of the antenna, thus having achieved optimal conditions for regulating the impedance of the resonant circuit. That is to say, the above conditions make it possible to change the impedance of the resonant circuit without changing the resonant frequency, by changing the capacitance values of the series capacitor and the parallel capacitor while maintaining the sum of the capacitance value of the series capacitor and the capacitance value of the parallel capacitor to be constant.

Figure 4:
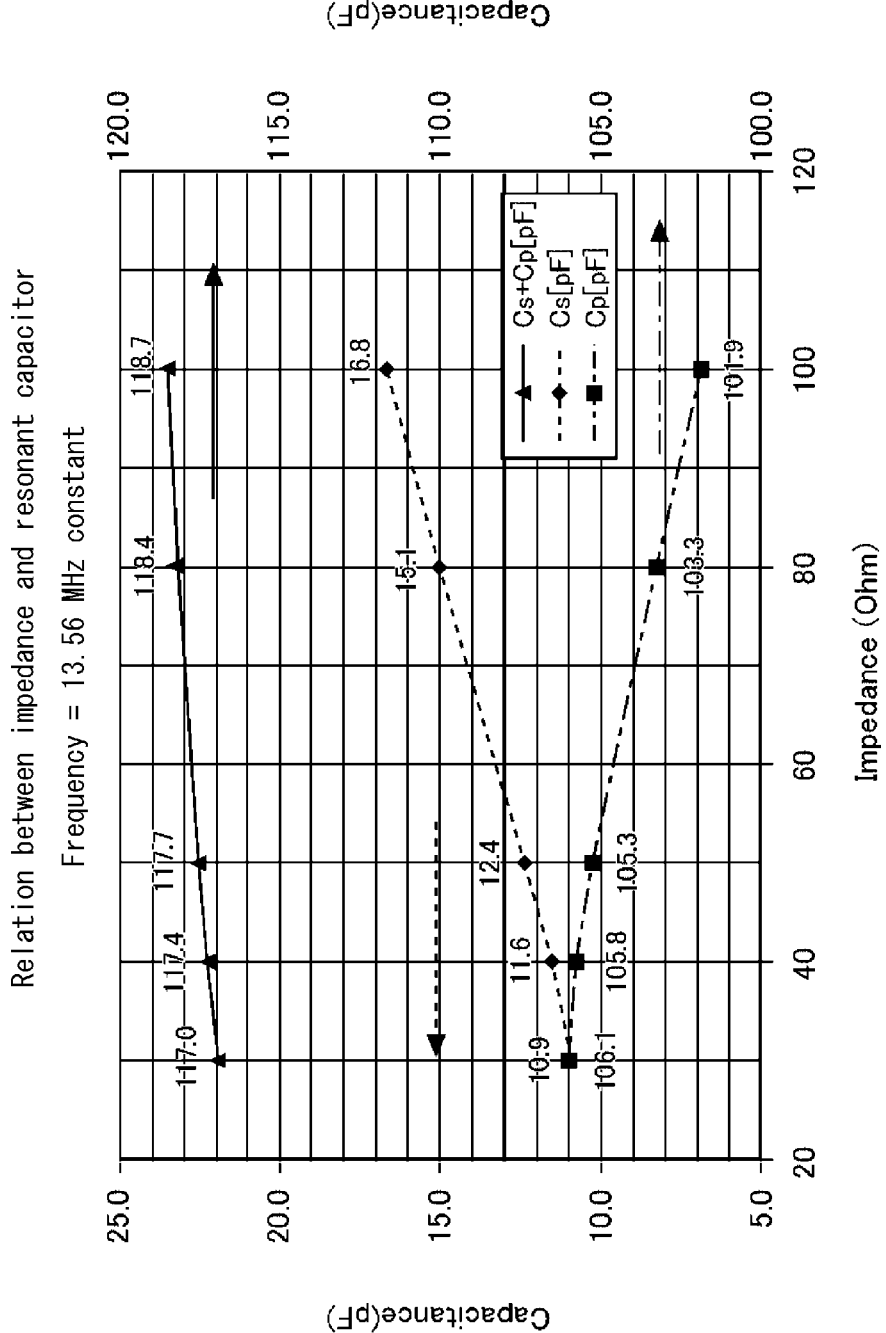
FIG. 4 is a graph illustrating a relation between impedance of a resonant circuit and a capacitance value of the resonant capacitor.

FIG. 4 illustrates calculated impedance changes plotted as a function of simultaneous changes in the series capacitor CS and the parallel capacitor CP while the inductance value of the antenna coil Lant is maintained to be constant in the circuit illustrated in FIG. 3A. As illustrated in FIG. 4, by increasing the capacitance value of the series capacitor CS and by reducing the capacitance value of the parallel capacitor CP by the increased capacitance value of the series capacitor CS, the impedance of the resonant circuit is increased while the resonant frequency is maintained to be constant. Similarly, by reducing the capacitance value of the series capacitor CS and by increasing the capacitance value of the parallel capacitor CP by the reduced capacitance value of the series capacitor CS, the impedance is reduced while the resonant frequency is maintained to be constant. Thus, increasing/decreasing the capacitance value of the series capacitor CS and the capacitance value of the parallel capacitor CP so that the sum of the capacitance value of the series capacitor CS and the capacitance value of the parallel capacitor CP remains substantially constant allows regulation of the impedance of the resonant circuit alone while maintaining the constant resonant frequency. Regulation of the impedance of the resonant circuit allows optimal settings to match the impedance conditions, thereby stabilizing communication and increasing the communication distance.

The use of a variable capacitance capacitor containing a ferroelectric thin film, as the series capacitor CS or the parallel capacitor CP, helps achieve a desired capacitance value in accordance with the direct current bias applied to the ferroelectric thin film. Herein, to maintain the sum of the series capacitor CS and the parallel capacitor CP to be constant, it is requisite that a change in the capacitance value of the series capacitor CS and a change in the capacitance value of the parallel capacitance CP are to be equal in amount and opposite in direction. Accordingly, changes in the direct current voltages applied to the series capacitor CS and the parallel capacitor CP need to be opposite in direction.

To this end, one only needs to apply a fixed voltage (+3[V]) to ends of the serially connected series capacitor CS and parallel capacitor CP and to apply a control voltage (Vc=0[V] to +3[V]) to the connection node between the series capacitor CS and the parallel capacitor CP. Consequently, a voltage of +3[V]−Vc is applied to the series capacitor CS, and a voltage of +Vc is applied to the parallel capacitor CP. Thus, in accordance with the control voltage Vc, voltages having the same voltage width but changed in opposite directions are applied to the series capacitor CS and the parallel capacitor CP.

Furthermore, to regulate the impedance of the resonant circuit while maintaining the resonant frequency to be constant, the capacitance value of the series capacitor CS is preferably less than the capacitance value of the parallel capacitor CP.

Supposing that a ferroelectric thin film has a fixed film thickness, it is generally necessary to increase areas of the ferroelectric thin film and the electrodes in order to increase the capacitance value. The capacitance value of a variable capacitance capacitor using a ferroelectric thin film changes in response to field intensity applied to the ferroelectric thin film. Accordingly, when the capacitance values of the series capacitor CS and the parallel capacitor CP are determined based on the areas of the capacitors (areas of the dielectrics), voltages applied to the series capacitor CS and the parallel capacitor CP need to be generated separately, and this leads to difficulty in control over the voltages. Accordingly, more elaborative ways are needed. One technically feasible method to avoid complexity of the control voltage values is to vary the film thickness of the ferroelectric. However, this method, especially when the variable capacitance capacitors are manufactured within a single manufacturing process, would be by far more expensive.

2-2. Operation of Variable Capacitance Circuit and Resonant Circuit

As illustrated in FIG. 1, the variable capacitance capacitors (CP1, CP2) 4a, 4b having the same capacitance value are connected in series, and the variable capacitance capacitor (CP3) 6 is connected in parallel with the serially connected variable capacitance capacitors (CP1, CP2) 4a, 4b. In the present embodiment, the connection is established in a manner such that direct current voltages are applied to ends of the serially connected variable capacitance capacitors (CP1, CP2) 4a, 4b and across the serially connected nodes. As a result, ends of the variable capacitance capacitor (CP3) 6 are always at a constant potential. Accordingly, regardless of whether or not the variable capacitance capacitor (CP3) 6 is a variable capacitance capacitor, the capacitance value of the variable capacitance capacitor (CP3) 6 remains unchanged with respect to the control voltage Vc.

Similarly to the parallel variable capacitance element 4, the connection is established for the series variable capacitance element 2 in a manner such that the two variable capacitance capacitors (CS1, CS2) 2a, 2b having the same capacitance value are connected in series and that direct current voltages are applied to ends of the serially connected variable capacitance capacitors (CS1, CS2) 2a, 2b and across the serially connected nodes.

With the above connection, the capacitance value of the serially connected variable capacitance capacitors (CS1, CS2) 2a, 2b is equalized with the capacitance value of the serially connected variable capacitance capacitor (CP1, CP2) 4a, 4b, and moreover, a change in the direct current voltage applied to the serially connected variable capacitance capacitors (CS1, CS2) 2a, 2b and a change in the direct current voltage applied to the serially connected variable capacitance capacitor (CP1, CP2) 4a, 4b are equal in amount and opposite in direction. Furthermore, since the parallel variable capacitance element 4 additionally includes the parallelly connected variable capacitance capacitor (CP3), whose capacitance is not voltage dependent, the capacitance value of the series variable capacitance element 2 is less than the capacitance value of the parallel variable capacitance element 4. Thus, a variable capacitance capacitor circuit in which the amount of change in the capacitance value of the series variable capacitance element 2 equals that of the capacitance value of the parallel variable capacitance element 4 is achieved.

A simulation is conducted to determine the changes in the capacitances of the capacitors in each element at the constants of FIG. 1.

At the circuit constants of FIG. 1, the capacitance of the series variable capacitance element 2 equals the total capacitance of the serially connected variable capacitance capacitor (CS1) 2a and variable capacitance capacitor (CS2) 2b. Accordingly, the capacitance of the series variable capacitance element 2 is $(100\,[\text{pF}]^{-1} + 100\,[\text{pF}]^{-1})^{-1} = 50\,[\text{pF}]$ (in an unbiased state). The capacitance of the parallel variable capacitance element 4 equals the total capacitance of the serially connected variable capacitance capacitor (CP1) 4a and variable capacitance capacitor (CP2) 4b, and the parallelly connected variable capacitance capacitor (CP3) 6. Accordingly, the capacitance of the parallel variable capacitance element 4 is $(100\,[\text{pF}]^{-1} + 100\,[\text{pF}]^{-1})^{-1} + 60\,[\text{pF}] = 110\,[\text{pF}]$ in an unbiased state.

An alternate current signal is inputted/outputted to/from the alternate current input (AC1) 8a through the direct current cut-off capacitor (C1) 9a. An alternate current signals is inputted/outputted to/from the alternate current terminal (AC3) 8c through the direct current cut-off capacitor (C2) 9b. The direct current cut-off capacitors (C1, C2) 9a, 9b may be selected in accordance with frequencies of the signals handled. Contactless communication systems using a typical carrier frequency utilizes a frequency of 13.56 MHz. In this case, when C1, C2=10 [nF] as illustrated in FIG. 1, the impedance at the frequency is approximately 10 mΩ. The impedance may be further reduced by using capacitors with greater capacitances, although doing so involves consideration of physical dimensions, costs, or the like of the capacitors.

The direct current bias resistances R1 to R5 may be set to values that are sufficiently greater than the impedance of each variable capacitance capacitor at the frequency handled. Depending on the frequency handled, high-frequency inductors may also be used instead of the resistances.

The fixed voltage of +3 [V] is applied across the direct current terminal 7a and the direct current terminal 7c, and the variable voltage Vc varying in the range from 0 [V] to +3 [V] is connected across the direct current terminal 7b and the direct current terminal 7c.

As shown in Table 1, the variable capacitance capacitors are set to have characteristics of 0.9 times at Vc=+1.5 [V] and 0.7 times at Vc=+3[V] relative to those in an unbiased state.

Table 1 shows the changes in the overall capacitance of the variable capacitance circuit of FIG. 1 and the changes in the respective capacitances in the variable capacitance capacitors in response to the variable voltage Vc varying in the range from 0 [V] to +3 [V].

TABLE 1

| | Control voltage Vc [V] | | | |
| --- | --- | --- | --- | --- |
| | 0.0 | 1.5 | 3.0 | Change in capacitance |
| | Voltage dependency of capacitance | | | |
| | ×1 | ×0.9 | ×0.7 | ΔC [pF] |
| Series capacitor $C_S = C_{S1}//C_{S2}$ [pF] | 50 | 45 | 35 | 15 |
| Parallel capacitor $C_{P1}//C_{P2}$ [pF] | 35 | 45 | 50 | −15 |

TABLE 1-continued

| | Control voltage Vc [V] | | | |
| --- | --- | --- | --- | --- |
| | 0.0 | 1.5 | 3.0 | Change in capacitance |
| | Voltage dependency of capacitance | | | |
| | ×1 | ×0.9 | ×0.7 | ΔC [pF] |
| Parallel fixed capacitor $C_{P3}$ [pF] | 60 | 60 | 60 | — |
| Parallel capacitor $C_p = (C_{p1}//C_{p2}) + C_{P3}$ [pF] | 95 | 105 | 110 | −15 |
| Series capacitor + Parallel capacitor $C_S + C_p$ [pF] | 145 | 150 | 145 | 5 |

The maximum amount of change in the capacitance of the series variable capacitance element 2 including the serially connected variable capacitance capacitors (CS1, CS2) 2a, 2b is 15 [pF]. The maximum amount of change in the capacitance of the serially connected variable capacitance capacitors (CP1, CP2) 4a, 4b is −15 [pF]. This indicates that the capacitance of the serially connected variable capacitance capacitors (CP1, CP2) 4a, 4b changes to offset the change in the capacitance of the series variable capacitance element 2. Table 1 also shows that the capacitance value of the variable capacitance capacitor (CP3) 6, which is connected in parallel with the serially connected variable capacitance capacitors (CP1, CP2) 4a, 4b, remains constant. As can be seen, the parallel variable capacitance element 4, in which those capacitors are combined, has a combined capacitance value of 95 [pF] to 110 [pF], which is greater than a combined capacitance value of 50 [pF] to 35 [pF] of the series variable capacitance element 2.

Figure 5:
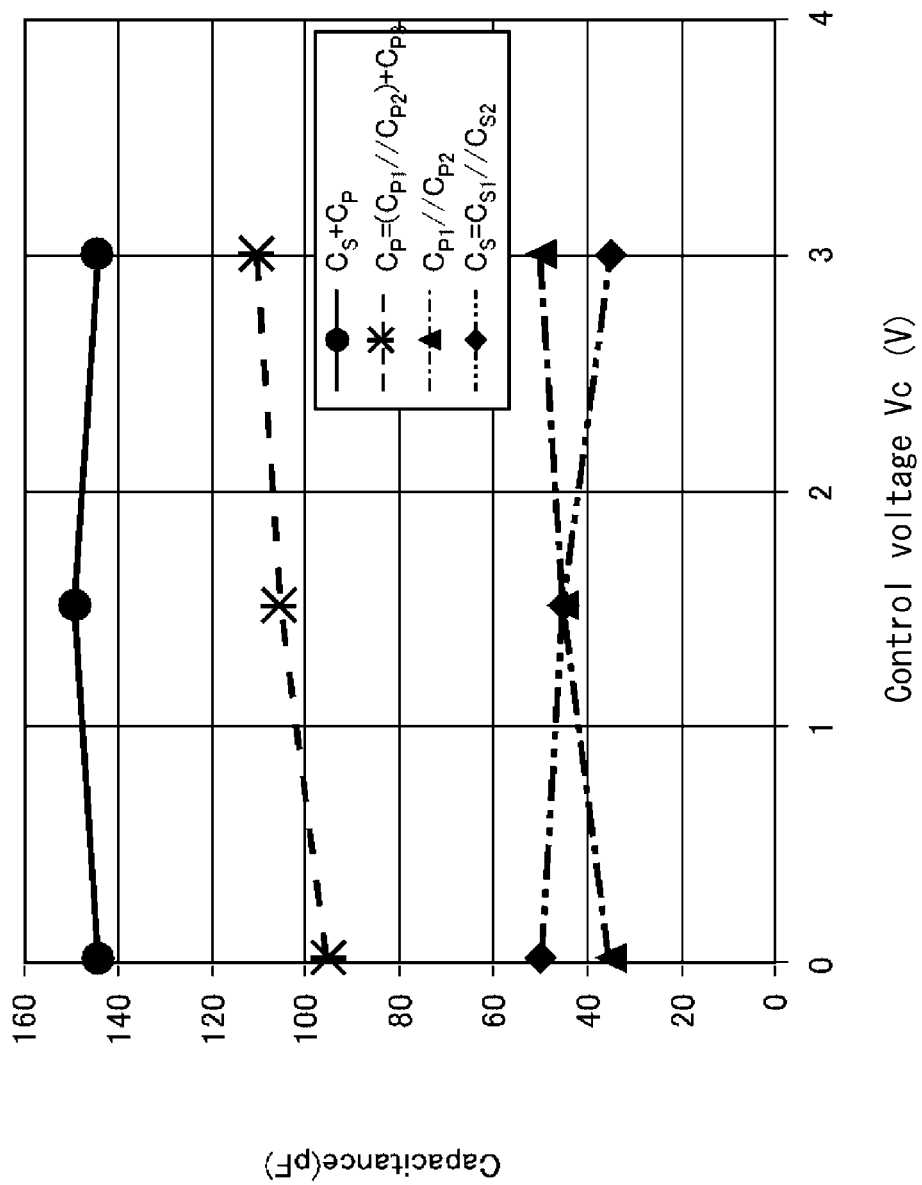
FIG. 5 is a graph illustrating how variable capacitance capacitors, when being installed in the circuit having circuit constants illustrated in FIG. 1, change in response to control voltages.

These circumstances are indicated more visually in a graph of FIG. 5. Since the serially connected variable capacitance capacitors (CS1, CS2) 2a, 2b and the equivalent variable capacitance capacitors (CP1, CP2) 4a, 4b are respectively charged with potential differences of +3 [V]−Vc and +Vc, the respective change amounts in the direct current voltages applied thereto are −ΔVc and ΔVc, with the absolute value of the change amounts being equal to each other and with the direction of changes being opposite to each other. Thus, as illustrated in FIG. 5, the sum of the capacitance value of the series variable capacitance element 2 and the capacitance value of the parallel variable capacitance element 4 remains substantially constant in the variable capacitance circuit 1, and the capacitance values of the series variable capacitance element 2 and the parallel variable capacitance element 4 may change by the same proportion.

(1) Modification 1

Figure 6:
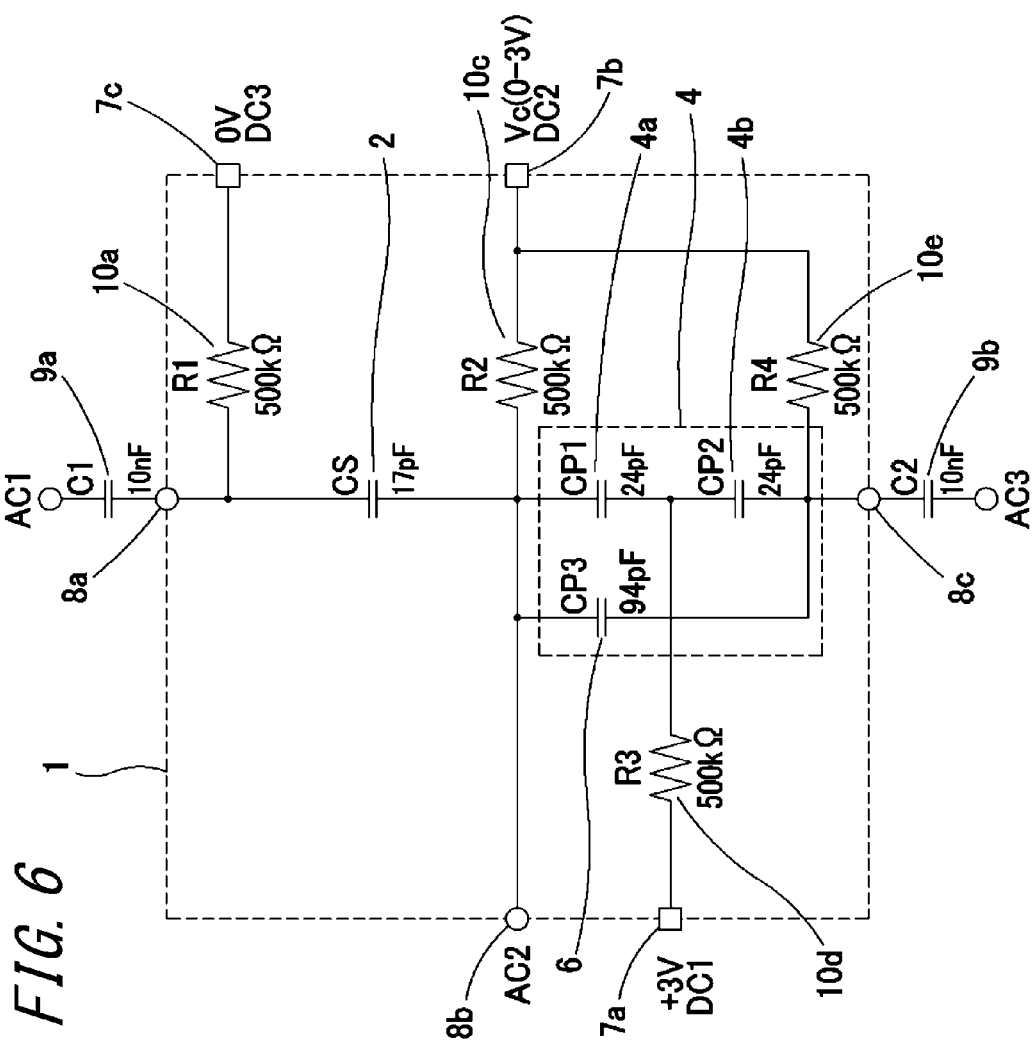
FIG. 6 is a circuit diagram illustrating a modification of the configuration of a variable capacitance circuit according to at least one embodiment of the present disclosure.

The configurations of the variable capacitance capacitors included in the variable capacitance circuit 1 may be modified to obtain the same results as described above. As illustrated in FIG. 6, the series variable capacitance element 2 does not need to include the two serially connected variable capacitance capacitors and may be configured by a single variable capacitance capacitor (CS).

In other words, the variable capacitance circuit 1 may include the series variable capacitance element 2, which is configured by the variable capacitance capacitor (CS), and the parallel variable capacitance element 4 connected in series with the series variable capacitance element 2. The parallel variable capacitance element 4 includes the two variable capacitance capacitors (CP1, CP2) 4a, 4b connected in series and the variable capacitance capacitor (CP3) 6 connected in parallel with the variable capacitance capacitors (CP1, CP2) 4a, 4b.

The serially connected series variable capacitance element 2 and parallel variable capacitance element 4 have one end and the other end that form the alternate current terminal (AC1) 8a and the alternate current terminal (AC3) 8c to/from which alternate signals are inputted/outputted through the direct current cut-off capacitor (C1) 9a and the direct current cut-off capacitor (C2) 9b, respectively. The alternate current terminal (AC2) 8b is connected to the connection node between the series variable capacitance element 2 and the parallel variable capacitance element 4.

The variable capacitance circuit 1 includes the three direct current terminals 7a, 7b, and 7c. The direct current terminal 7a is connected to the connection node between the variable capacitance capacitor (CP1) 4a and the variable capacitance capacitor (CP2) 4b through a direct current bias resistance (R3) 10d. The direct current terminal 7b is connected to the alternate current terminal 8c through a direct current bias resistance (R4) 10e, to the connection node between the series variable capacitance element 2 and the parallel variable capacitance element 4 through a direct current bias resistance (R2) 10e. The direct current terminal 7c is connected to the alternate current terminal (AC1) 8a through the direct current bias resistance (R1) 10a. The direct current terminal 7c is connected to the direct current ground potential (0 V), and a fixed direct current voltage (+3V) is inputted across the direct current terminal 7a and the direct current terminal 7c. A variable direct current voltage (Vc) that varies between the direct current terminal 7a and the direct current terminal 7c is inputted to the direct current terminal 7b.

The present modification allows reduction of the number of the variable capacitance capacitors compared with the variable capacitance circuit of FIG. 1 and thus, paves the way for miniaturization and cost reduction.

Similarly to the case of FIG. 1, a simulation is conducted to determine the changes in the capacitances of the capacitors at the constants of FIG. 6.

As shown in Table 2, the variable capacitance capacitors are set to have characteristics of 0.81 times at Vc=+1.5 [V] and 0.63 times at Vc=+3[V] relative to those in an unbiased state. According to these conditions, the variable capacitance capacitors are presumed to be more voltage dependent and exhibit greater non-linearity than under the conditions of Table 1 and are considered to have voltage characteristics closer to those of the capacitance of an actual variable capacitance capacitor using a ferroelectric.

Table 2 shows the changes in the overall capacitance of the variable capacitance circuit of FIG. 1 and the changes in the respective capacitances in the variable capacitance capacitors in response to the variable voltage Vc varying in the range from 0 [V] to +3 [V].

TABLE 2

| | Control voltage Vc [V] | | | |
| --- | --- | --- | --- | --- |
| | 0.0 | 1.5 | 3.0 | |
| | Voltage dependency of capacitance | | | Change in capacitance |
| | ×1 | ×0.81 | ×0.63 | ΔC [pF] |
| Series capacitor $C_S = C_{S1} // C_{S2}$ [pF] | 10.7 | 13.8 | 17.0 | −6.3 |
| Parallel capacitor $C_{P1} // C_{P2}$ [pF] | 12.0 | 10.8 | 7.6 | 4.4 |
| Parallel fixed capacitor $C_{P3}$ [pF] | 94.0 | 94.0 | 94.0 | — |

TABLE 2-continued

| | Control voltage Vc [V] | | | |
| --- | --- | --- | --- | --- |
| | 0.0 | 1.5 | 3.0 | |
| | Voltage dependency of capacitance | | | Change in capacitance |
| | ×1 | ×0.81 | ×0.63 | ΔC [pF] |
| Parallel capacitor $C_p = (C_{p1} // C_{p2}) + C_{P3}$ [pF] | 106.0 | 104.8 | 101.6 | 4.4 |
| Series capacitor + Parallel capacitor $C_S + C_p$ [pF] | 116.7 | 118.6 | 118.6 | 1.9 |

The maximum amount of change in the capacitance of the variable capacitance capacitor (CS) constituting the series variable capacitance element 2 is −6.3 [pF]. The maximum amount of change in the capacitance of the serially connected variable capacitance capacitors (CP1, CP2) 4a, 4b is 4.4 [pF]. This indicates that the capacitance of the serially connected variable capacitance capacitors (CP1, CP2) 4a, 4b changes to substantially offset the change in the capacitance of the series variable capacitance element 2. Table 2 also shows that the capacitance of the variable capacitance capacitor (CP3) 6, which is connected in parallel with the serially connected variable capacitance capacitors (CP1, CP2) 4a, 4b, remains constant. As can be seen, the parallel variable capacitance element 4, in which those capacitors are combined, exhibits the change in the capacitance indicated by a combined capacitance value of 106 [pF] to 101.6 [pF], which is greater than a combined capacitance value of 10.7 [pF] to 17 [pF] of the series variable capacitance element 2.

Figure 7:
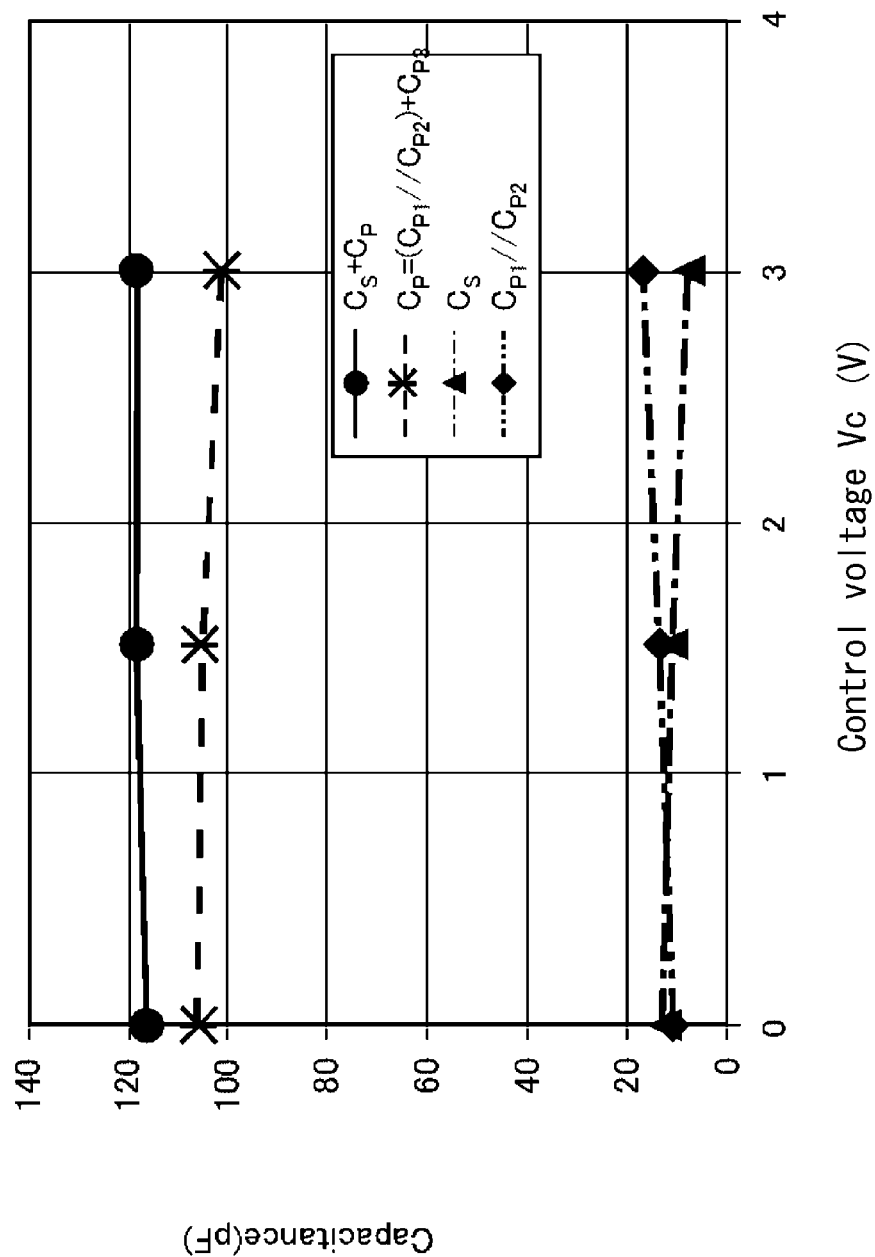
FIG. 7 is a graph illustrating how variable capacitance capacitors, when being installed in the circuit having circuit constants illustrated in FIG. 6, change in response to control voltages.

These results shown in Table 2 are indicated more visually in a graph of FIG. 7. Similarly to the case of Table 1 and FIG. 1, since the variable capacitance capacitor (CS) and the serially connected variable capacitance capacitors (CP1, CP2) 4a, 4b are respectively charged with potential differences of +Vc and 3 [V]+Vc, the respective change amounts in the direct current voltages applied thereto are ΔVc and −ΔVc, with the changes being equal in absolute value and opposite in direction. Thus, as illustrated in FIG. 7, the sum of the capacitance value of the series variable capacitance element 2 and the capacitance value of the parallel variable capacitance element 4 remains substantially constant in the variable capacitance circuit 1, and the capacitance values of the series variable capacitance element 2 and the parallel variable capacitance element 4 may change by the same proportion. Additionally, in the configuration illustrated in FIG. 6, the fixed direct current bias (+3 [V]) is applied in the opposite direction to that in the case of FIG. 1, the direction of the changes in the direct current voltage in response to the variable voltage Vc varying in the range from 0 [V] to +3 [V] is opposite, and as a result, the direction of the changes in the capacitances is also opposite.

The above simulation results indicate that the present case also yields substantially the same capacitance values as those in FIG. 4, that is to say, adopting the variable capacitance capacitor using the circuit constants of FIG. 6 and varying the control voltage Vc in the range from 0 [V] to +3 [V] allows the changes in the impedance of the resonant circuit between 30Ω and 100Ω while maintaining the resonant frequency to be constant.

(2) Modification 2 (Balanced Circuit)

Figure 8:
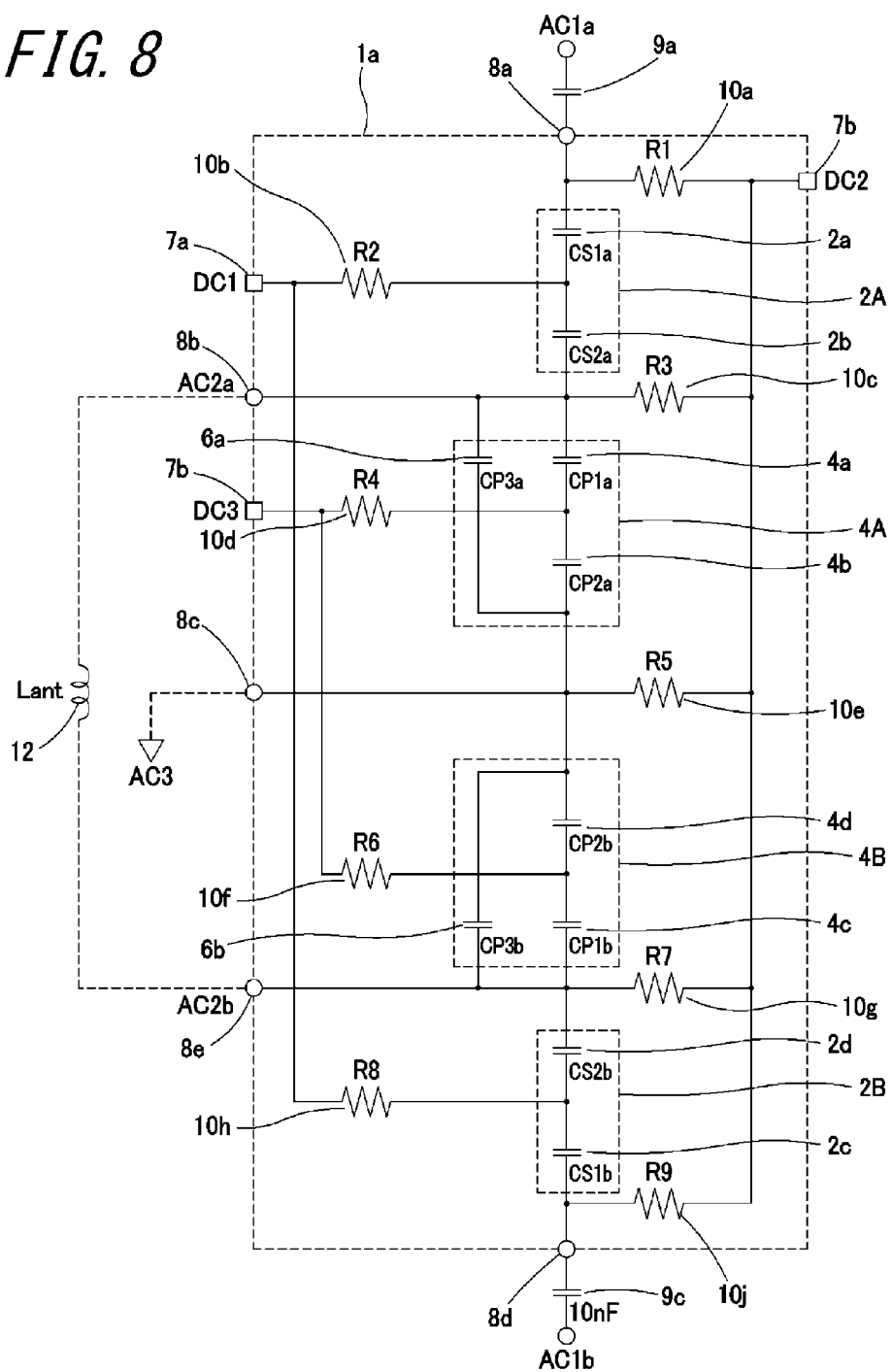
FIG. 8 is a circuit diagram illustrating a modification of the configuration of a variable capacitance circuit according to at least one embodiment of the present disclosure.

The variable capacitance circuit according to the present disclosure does not need to be configured as the unbalanced circuit as described above and may be configured as a balanced circuit. As illustrated in FIG. 8, the balanced circuit may be configured by an unbalanced circuit and an inverted unbalanced circuit arranged symmetrically with respect to each other about the alternate current ground potential. That is to say, the balanced variable capacitance circuit includes an in-phase circuit and an inverse-phase circuit obtained by inverting the in-phase circuit symmetrically about the alternate current ground potential thereof.

In detail, a variable capacitance circuit 1a forming the balanced circuit includes the in-phase circuit including a series variable capacitance element 2A and a parallel variable capacitance element 4A connected in series with the series variable capacitance element 2A. The series variable capacitance element 2A includes two variable capacitance capacitors (CS1a, CS2a) 2a, 2b connected in series, and the parallel variable capacitance element 4A includes two variable capacitance capacitors (CP1a, CP2a) 4a, 4b connected in series and a variable capacitance capacitor (CP3a) 6a connected in parallel with the variable capacitance capacitors (CP1a, CP2a) 4a, 4b. In the in-phase circuit, the serially connected series variable capacitance element 2A and parallel variable capacitance element 4A have one end and the other end that include the alternate current terminal (AC1a) 8a and the alternate current terminal (AC3) 8c to/from which alternate signals are inputted/outputted through the direct current cut-off capacitor 9a and the direct current cut-off capacitor (C2) 9b, respectively. The variable capacitance circuit 1a further includes the inverse-phase circuit with the alternate current input (AC3) 8c at the alternate current ground potential and with the same configuration as the in-phase circuit. The inverse-phase circuit includes a series variable capacitance element 2B and a parallel variable capacitance element 4B connected in series with the series variable capacitance element 2B. The series variable capacitance element 2B includes two variable capacitance capacitors (CS1b, CS2b) 2c, 2d connected in series, and the parallel variable capacitance element 4B includes variable capacitance capacitors (CP1b, CP2b) 4c, 4d connected in series and a variable capacitance capacitor (CP3b) 6b connected in parallel with the variable capacitance capacitors (CP1b, CP2b) 4c, 4d. In the inverse-phase circuit, the serially connected series variable capacitance element 2B and parallel variable capacitance element 4B have one end and the other end that include an alternate current terminal (AC1b) 8e and the alternate current terminal (AC3) 8c to/from which alternate signals are inputted/outputted through the direct current cut-off capacitor 9c and the direct current cut-off capacitor (C2) 9b, respectively. The inverse-phase circuit and the in-phase circuit include the alternate current terminal (AC3) 8c in common.

The number of the direct current terminals is also three in the balanced circuit. The direct current terminal 7a is connected to a connection node between the variable capacitance capacitor (CS1a) 2a and the variable capacitance capacitor (CS2a) through the direct current bias resistance (R2) 10b and to a connection node between the variable capacitance capacitor (CS1b) 2c and the variable capacitance capacitor (CS2b) 2d through a direct current bias resistance (R8) 10h.

The direct current terminal 7b is connected to the alternate current terminal 8a through the direct current bias resistance (R1) 10a, to the alternate current terminal 8b through the direct current bias resistance (R3) 10c, to the alternate current terminal 8c through the direct current bias resistance (R5), to the alternate current terminal 8d through a direct current bias resistance (R7), and to the alternate current terminal 8e through a direct current bias resistance (R9) 10j.

The direct current terminal 7c is connected to the connection node between the variable capacitance capacitor (CP1a) 4a and the variable capacitance capacitor (CP2a) 4b through the direct current bias resistance (R4) 10d and to a connection node between the variable capacitance capacitor (CP1b) 4c and the variable capacitance capacitor (CP2b) 4d through a direct current bias resistance (R6) 10f.

As a direct current bias that is to be applied to the series variable capacitance elements 2a, 2b and the parallel variable capacitance elements 4a, 4b included in the variable capacitance circuit 1a, one only needs to apply the fixed voltage (+3[V]) to the direct current terminal 7a and to apply the variable voltage Vc (=0[V] to +3[V]) to the direct current terminal 7b, while the direct current terminal 7c is grounded (0 [V]) in a direct current sense. The above connections bias the in-phase circuit and the inverse-phase circuit into the same direct current bias state, with a change in the direct current voltage applied to the series variable capacitance elements 2A, 2B and a change in the direct current voltage applied the parallel variable capacitance elements 4A, 4B being equal in amount and opposite in direction, as is similar to the case of FIG. 1 or the like.

When the variable capacitance circuit forming the balanced circuit is used as a resonant circuit, as illustrated by a dashed-line connection in FIG. 8, a coil 12 may be connected across the alternate current terminal (AC2a) 8b and the alternate current terminal (AC2b), and the alternate current terminal (AC3) 8c may be grounded in an alternate current sense through the direct current cut-off capacitor (C2) 9b. Regarding input/output signals, as balanced signals (or differential signals), an in-phase signal may be applied to the alternate current terminal (AC1a) 8a, and an inverse-phase signal may be applied to the alternate current terminal (AC1b) 8e.

Although in the above description the circuit configuration of FIG. 1 is used in the in-phase circuit and the inverse-phase circuit included in the balanced circuit, needless to say, any circuit configuration such as that of FIG. 6 including the reduced number of elements may also be used in the in-phase circuit and the inverse-phase circuit.

(3) Modification 3 (Amplifying Circuit)

The application of the variable capacitance circuit 1 according to the present disclosure is, of course, not limited to the resonant circuit with the coil and may include other circuits.

Figure 9:
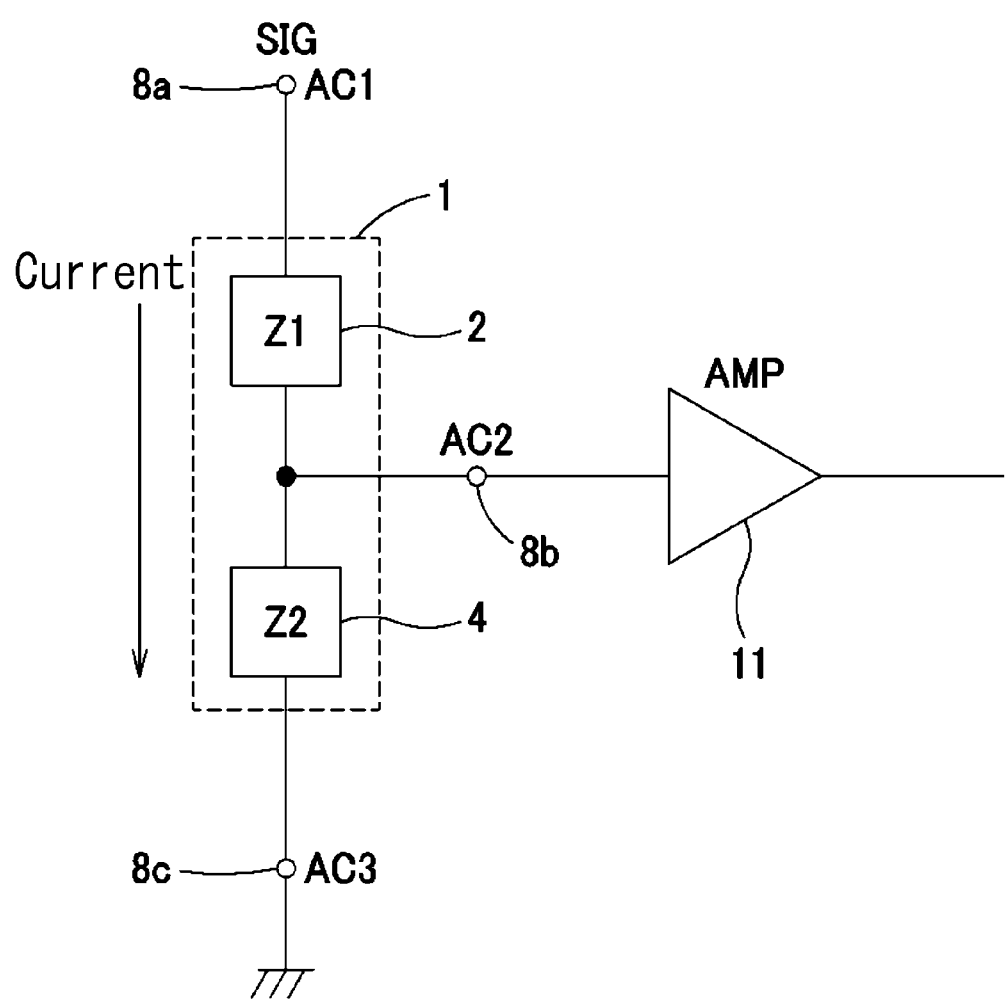
FIG. 9 is a circuit diagram illustrating an exemplary configuration of an amplifying circuit according to at least one embodiment of the present disclosure.

As illustrated in FIG. 9, the variable capacitance circuit 1 may be used for connection through which a partial pressure signal of an alternate current signal SIG is inputted to an amplifier 11. The alternate current signal SIG is inputted to the alternate current terminal 8a (AC1), and the other alternate current terminal 8c (AC3) is grounded in an alternate current sense. The alternate current terminal (AC2) 8b, that is, the connection node between the series variable capacitance element 2 and the parallel variable capacitance element 4, is connected to an input of the amplifier 11. With the above connections, the capacitance values of the series variable capacitance element 2 and the parallel variable capacitance element 4 may be changed with use of the direct current biases (whose circuit configuration is not illustrated). On the other hand, since the series variable capacitance element 2 and the parallel variable capacitance element 4 are connected in parallel in an alternate current sense, the sum of the capacitance values of the series variable capacitance element 2 and the parallel variable capacitance element 4 remain constant even when the capacitance values are changed. Accordingly, by using the SIG, an alternate current voltage flowing through the variable capacitance circuit 1 is maintained to be constant, and the impedance on the input side of the amplifier 11 is always constant.

3. Exemplary Variable Capacitance Devices

The variable capacitance circuit according to the present disclosure may be embodied as a variable capacitance device integrating a plurality of variable capacitance capacitors. As described earlier, an increase in the capacitance value of a series variable capacitance element requires a reduction in the capacitance value of a parallel variable capacitance element, and vice versa. Moreover, to maintain the sum of the capacitance values of the series variable capacitance element and the parallel variable capacitance element to be substantially constant, the magnitudes of changes in the capacitances of these variable capacitance elements need to be substantially equalized.

Generally, a capacitance change rate of a capacitance value of a variable capacitance capacitor in response to a direct current voltage applied thereto is proportional to intensity of a direct current voltage applied to the dielectric film, i.e., field intensity applied to the dielectric film. The magnitude of change in the capacitance value is a product of the capacitance value and the capacitance change rate. This means that two variable capacitance capacitors having the same dielectric film thickness and different capacitance values, when being multiplied by the same capacitance change rate, will not obtain the same magnitude of change in the capacitances.

According to the circuit configuration of FIGS. 1 and 6, a manufacturing process of variable capacitance capacitors including dielectric layers having the same thickness may be used. Even when the conventional manufacturing process is used, the circuit configuration of FIGS. 1 and 6 allow the variable capacitance elements having different capacitance values to achieve substantially the same magnitude of change in the capacitances in response to the same magnitude of change in the direct current voltage. This allows use of dielectrics made of the same material and having the same thickness, and thus, simplifies manufacturing. As a result, low cost variable capacitance devices are provided. At this time, circuits with bias resistances may be built into a device as illustrated in FIGS. 1 and 6, or, alternatively, circuits without resistances may be built into a device. Suitable examples of the former device include a device called a thin film capacitor that includes a ferroelectric formed and sintered on silicon by spin coating, sputtering, or the like. Suitable examples of the latter device include a device called a multi-layer ceramic capacitor that includes a stack of dielectrics each applied onto a film called a green sheet and sintered.

The variable capacitance circuit (of FIG. 8) corresponding to the balanced circuit may also be embodied in a single-package variable capacitance device. Two unbalanced variable capacitance circuits may be built into a single package, or those in the form of a single balanced circuit may be configured as a variable capacitance device.

FIGS. 10A to 10C and FIGS. 11A to 11C each illustrate an exemplary shape and terminal arrangement of such a variable capacitance device with a built-in variable capacitance circuit.

Figure 10A:
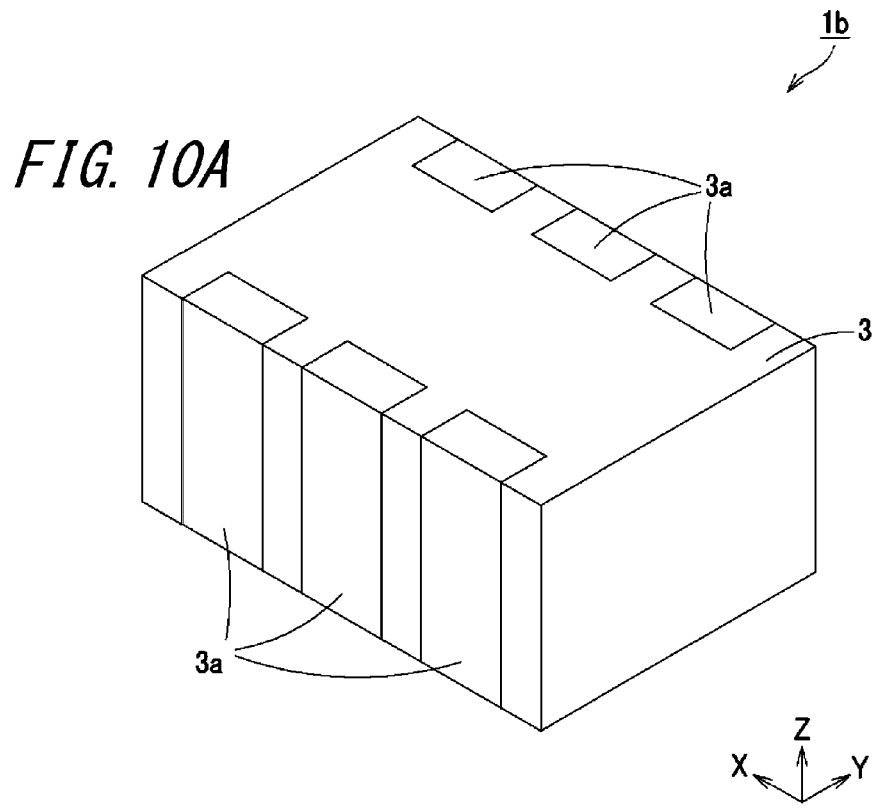
FIGS. 10A to 10C each illustrate an exemplary shape and terminal arrangement of a variable capacitance device according to at least one embodiment of the present disclosure.

As illustrated in FIG. 10A, a variable capacitance device 1b includes a hexahedral main body 3 provided with the variable capacitance circuit 1 and a plurality of electrodes 3a formed on lateral surfaces of the main body 3. The electrodes 3a are formed in correspondence with the alternate current terminals 8a to 8c and the direct current terminals 7a to 7c. As illustrated in FIG. 10A, the thickness direction of the main body is defined as a z-axis direction, a direction extending along a long side of the main body 3 that is perpendicular to the thickness direction is defined as an x-axis direction, a direction extending along a short side of the main body 3 is defined as a y-axis direction. One of the surfaces lying in an x-y plane is defined as an upper surface, and the other one of the surfaces lying in the x-y plane is defined as a lower surface. Surfaces extending perpendicular to the upper and the lower surface are defined as lateral surfaces. Some of the electrodes 3a may be formed along the x-axis of the main body 3 on one lateral surface and may have rectangular shapes extending to the upper and the lower surface (the lower surface being not illustrated). Other electrodes 3a may also be formed on another lateral surface opposing to the one lateral surface and may extend to the upper and the lower surface. The electrodes 3a do not need to be formed on the two lateral surfaces and may be formed on three or four lateral surfaces. Furthermore, the electrodes are not limited to those formed on lateral surfaces and may also be ball grids configured by solder balls or the like and formed on the lower surface of the main body 3. Needless to say, any other well-known technique of forming electrodes may be adopted.

The main body 3 may be formed by stacking and sintering at a high temperature a plurality of dielectric layers each including a dielectric with an internal electrode forming the variable capacitance capacitors 2a, 2b or the like. Alternatively, the main body 3 may be formed by mounting, to an epoxy resin or a ceramic package, a variable capacitance circuit substrate provided with the variable capacitance circuit formed by the stacking and the high-temperature sintering.

Figure 10B:
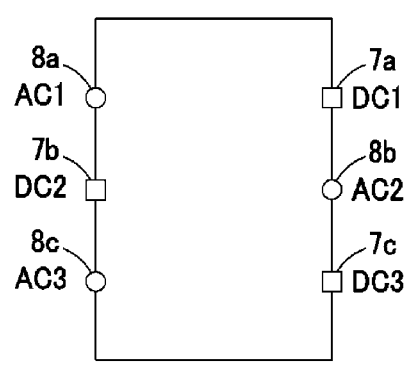
Figure 10C:
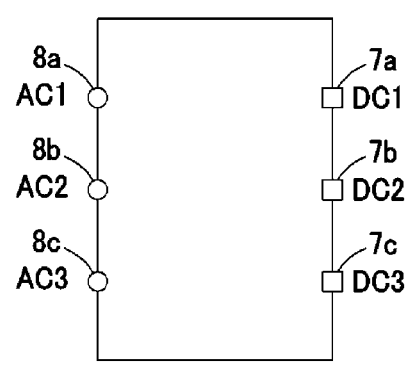

FIG. 10B illustrates an exemplary terminal arrangement when a variable capacitance circuit corresponding to the unbalanced circuit is built in, and 10B is a plan (top) view of an appearance of the variable capacitance device 1b provided with the single-package variable capacitance circuit 1 illustrated inside the dashed-line in FIG. 1. The first and the third alternate current terminal 8a, 8c (AC1, AC3) and the second direct current terminal 7b (DC2) may be arranged on one lateral surface of the variable capacitance device 1b that extends along the x-axis direction. The second alternate current terminal 8b (AC2) and the first and the third direct current terminal 7a, 7c (DC1, DC3) may be arranged on another lateral surface opposing to the one lateral surface. In this example, the terminals for input/output of alternate current signals are gathered on the one lateral surface, and the terminals for alternate current grounding are arranged on the other lateral surface. As illustrated in FIG. 10C, the three alternate current terminals 8a to 8c (AC1 to AC3) and the three direct current terminals 7a to 7c (DC1 to DC3) may be arranged in one lateral surface and the opposing lateral surface, respectively.

Figure 11A:
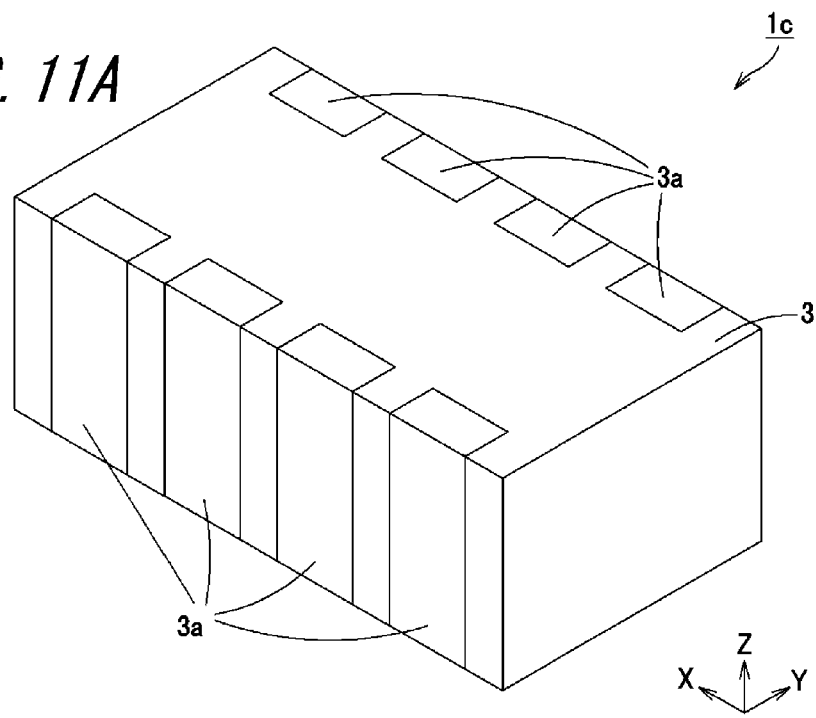
FIGS. 11A to 11C each illustrate an exemplary shape and terminal arrangement of a variable capacitance device according to another embodiment of the present disclosure.

As illustrated in FIG. 11A, a variable capacitance device 1c includes a hexahedral main body 3 provided with a variable capacitance circuit 1a corresponding to the balanced circuit and a plurality of electrodes 3a formed on lateral surfaces of the main body 3. The electrodes 3a are formed in correspondence with the first to the fifth alternate current terminals 8a to 8e and the first to the third direct current terminals 7a to 7c.

Figure 11B:
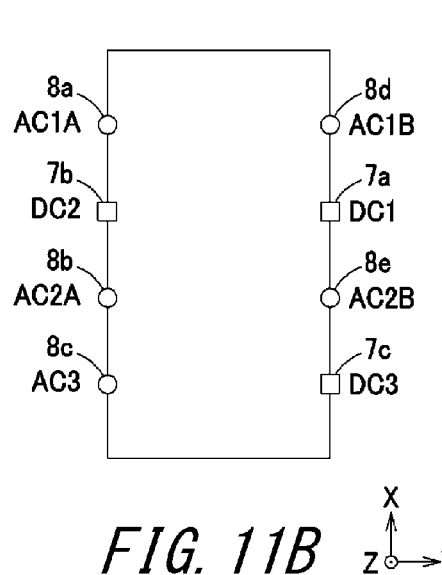
Figure 11C:
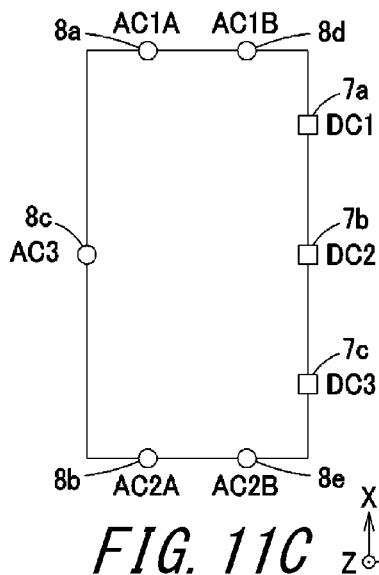

FIG. 11B is a plan view illustrating an exemplary terminal arrangement of the variable capacitance device 1c provided with the single-package variable capacitance circuit 1a illustrated inside the dashed-line in FIG. 8. The alternate current terminals 8a, 8b (AC1A, AC2A) for in-phase signals and the alternate current terminals 8d, 8e (AC1B, AC2B) for inverse-phase signals included in the balanced circuit are arranged on one lateral surface and the opposing surface, respectively. As illustrated in FIG. 11B, the terminals may also be arranged by using all the four lateral surfaces of the variable capacitance device. Since a large current is applied to the alternate current terminals (AC1 to AC3), areas of the electrodes may be increased to reduce direct current resistance.

As described above, the variable capacitance circuit and the variable capacitance device with the built-in variable capacitance circuit according to the present disclosure are each capable of maintaining the sum of the variable capacitance values of the two variable capacitance elements to be substantially constant even when the respective capacitance values are changed. Furthermore, the variable capacitance device may be configured by using dielectrics made of the same material and having the same thickness, and therefore, the conventional manufacturing process may be utilized. As a result, miniaturized, thinned, and low-cost variable capacitance devices are provided.

In use, a single control power source, in addition to a power source and a GND, suffices as a direct current power source for controlling the capacitance values of the variable capacitance elements. Thus, the control circuit is not complicated, and the low-cost control circuit is provided.

4. Exemplary Contactless Communication Device

<Exemplary Configuration of Contactless Communication Device>

The resonant circuit 20 according to the present disclosure may be used in a contactless communication device 40 for contactless communication with another contactless communication device. The contactless communication device 40 is, for example, a reader/writer included in a contactless communication system. The other contactless communication device is, for example, a contactless communication module according to Near Field Communication (NFC) or the like that is embedded in a mobile phone.

Figure 12:
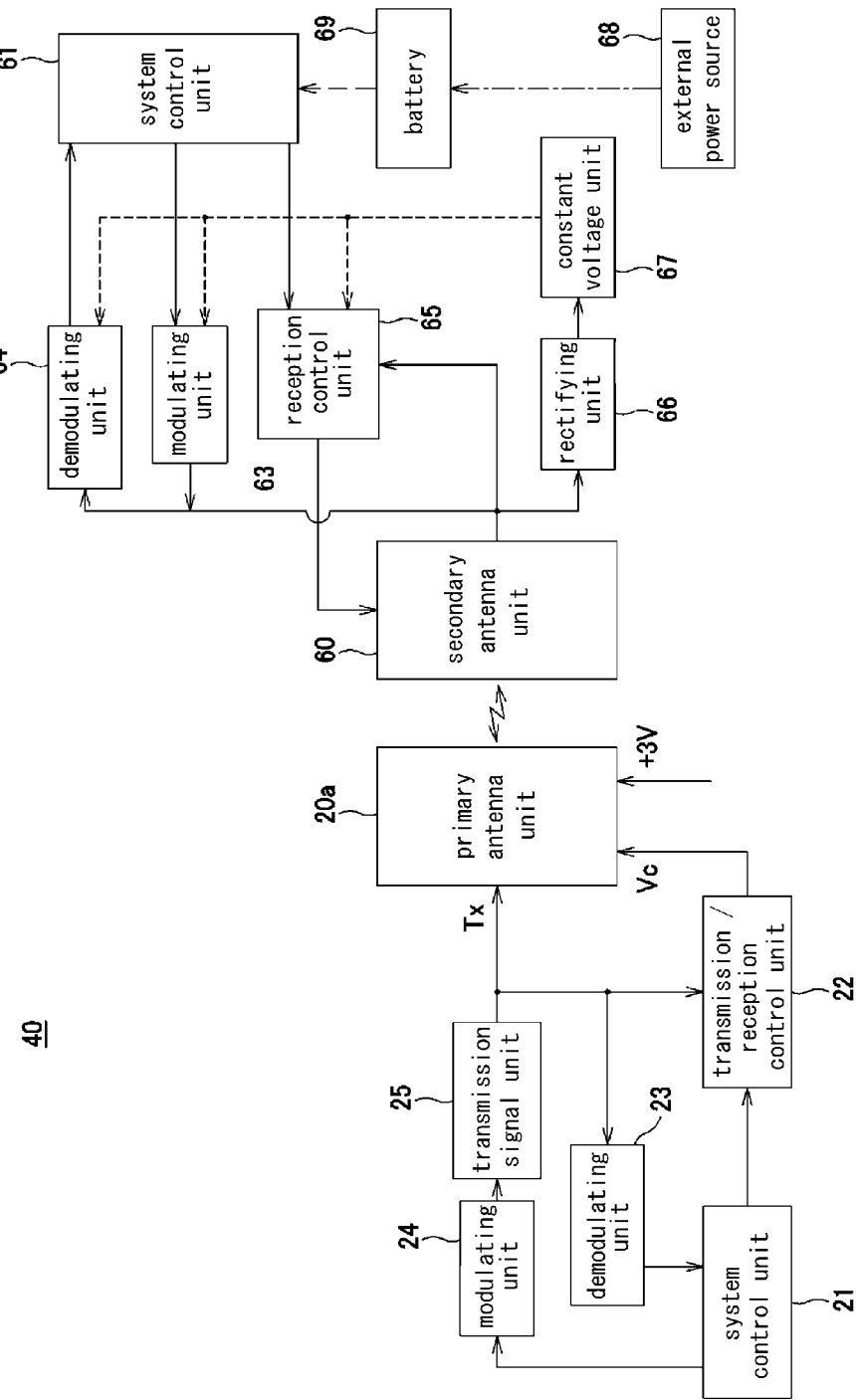
FIG. 12 is a block diagram illustrating an exemplary configuration of a contactless communication system including a contactless communication device according to at least one embodiment of the present disclosure.

As illustrated in FIG. 12, the contactless communication device 40 serving as the reader/writer in the contactless communication system includes a primary antenna unit 20a provided with the resonant circuit including the variable capacitance circuit 1 and the coil 12. The contactless communication device 40 further includes a system control unit 21 configured to control operation of the contactless communication device 40, a modulating unit 24 configured to modulate a transmission signal based on an instruction from the system control unit 21, and a transmission signal unit 25 configured to output, to the primary antenna unit 20a, a carrier signal resulting from the modulation of the transmission signal by the modulating unit 24. Furthermore, the contactless communication device 40 includes a demodulating unit 23 configured to demodulate the modulated carrier signal received from the transmission signal unit 25.

Through the primary antenna unit 20a, the contactless communication device 40 transmits a signal to the contactless communication module including a secondary antenna unit 60. The contactless communication module, which receives the signal by the secondary antenna unit 60, includes a demodulating unit 64 configured to demodulate the received signal, a system control unit 61 configured to control operation of the contactless communication module by using the demodulated signal, and a reception control unit 65 configured to control the condition of reception by regulating parameters of the resonant capacitors and the antenna coil included in the secondary antenna unit 60 based on the received signal. The contactless communication module includes a rectifying unit 66 configured to rectify the signal received by the secondary antenna unit 60 and thus, supplies power to each unit through a constant voltage unit 67 by using the rectified voltage. When the contactless communication module is a portable terminal device, such as a mobile phone, that includes a power source (battery 69), power may be supplied to each unit from the battery 69 and also from an external power source 68, such as an AC adaptor.

Figure 13:
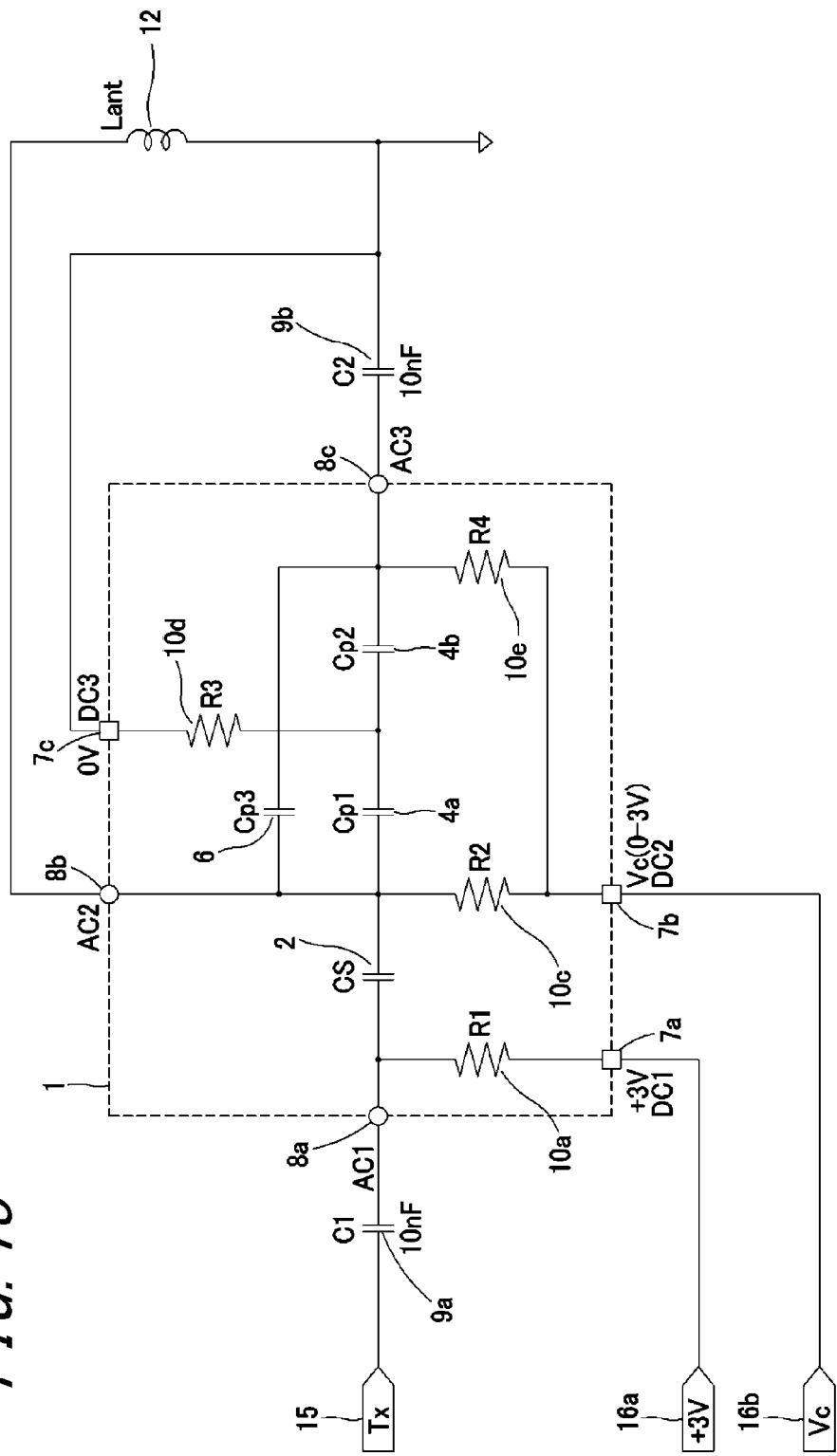
FIG. 13 is a circuit diagram illustrating an exemplary configuration of a primary antenna unit.

FIG. 13 illustrates an exemplary configuration of the primary antenna unit 20a. The variable capacitance circuit 1 included in the primary antenna unit 20a is the same as that with the exemplary configuration of FIG. 6. That is to say, the primary antenna unit 20a includes the series variable capacitance element 2, which includes the variable capacitance capacitor (CS), and the parallel variable capacitance element 4 connected in series with the series variable capacitance element 2. The parallel variable capacitance element 4 includes the two variable capacitance capacitors (CP1, CP2) 4a, 4b connected in series and the variable capacitance capacitor (CP3) 6 connected in parallel with the variable capacitance capacitors (CP1, CP2) 4a, 4b.

The serially connected series variable capacitance element 2 and parallel variable capacitance element 4 have one end and the other end that form the alternate current terminal 8a (AC1) and the alternate current terminal 8c (AC3) to/from which alternate signals are inputted/outputted through the direct current cut-off capacitor 9a (C1) and the direct current cut-off capacitor 9b (C2), respectively. The alternate current terminal (AC2) 8b is connected to the connection node between the series variable capacitance element 2 and the parallel variable capacitance element 4.

The direct current terminal 7a in the variable capacitance circuit 1 is connected to the alternate current terminal (AC1) 8a through the direct current bias resistance (R1) 10a. The direct current terminal 7b is connected to the alternate current terminal 8b through a direct current bias resistance (R2) 10c and to the alternate current terminal 8c through the direct current bias resistance (R4) 10e. The direct current terminal 7c is connected to the connection node between the variable capacitance capacitor (CP1) 4a and the variable capacitance capacitor (CP2) 4b through the direct current bias resistance (R3) 10d. The direct current terminal 7c is direct current grounded (0 [V]). The direct current terminal 7a is connected to a connection terminal 16a from which the fixed voltage (+3[V]) is delivered to the direct current terminal 7c. The direct current terminal 7b is connected to a connection terminal 16b from which the variable voltage Vc varying in the range from 0 [V] to +3 [V] is delivered to the direct current terminal 7c. The alternate current terminal (AC1) 8a is connected to an alternate current signal input/output terminal 15 through the direct current cut-off capacitor (C1) 9a.

The coil (Lant) 12 included in the resonant circuit has one end that is connected to the alternate current terminal (AC2) 8b and the other end that is connected to the alternate current terminal (AC3) 8c through the direct current cut-off capacitor (C2) 9b.

Although in the above description the transmission signal unit 25 is configured for balanced output, when the transmission signal unit 25 is configured for unbalanced output, an unbalanced variable capacitance circuit may be used to configure the resonant circuit.

<Operation of Contactless Communication Device>

A description is given below of operation of the contactless communication device 40 including the primary antenna unit 20a using a resonant circuit including the variable capacitance circuit 1.

The contactless communication device 40 performs impedance matching with the primary antenna unit 20a based on a carrier signal that the transmission signal unit 25 outpus. The contactless communication device 40 also regulates the resonant frequency of the resonant circuit in accordance with the condition of reception of the receiver, i.e., the contactless communication module. The modulating unit 24 may use modulation formats and encoding formats, such as Manchester encoding format and an Amplitude Shift Keying (ASK) modulation format, that are typically employed in reader/writers. The carrier frequency is typically 13.56 MHz.

A transmission/reception control unit 22 controls the variable voltage Vc of the primary antenna unit 20a to achieve the impedance matching by monitoring the transmission voltage and the transmission current of the outputted carrier signal, for impedance regulation.

The signal transmitted from the contactless communication device 40 is received by the secondary antenna unit 60, and the received signal is demodulated by the demodulating unit 64. The contents of the demodulated signal are determined by the system control unit 61, and the system control unit 61 generates a response signal based on a determination result. Additionally, the reception control unit 65 may also regulate the resonant frequency to optimize the condition of reception by regulating the resonant parameters or the like of the secondary antenna unit 60 based on the amplitude, the voltage phase, and the current phase of the received signal.

The contactless communication module modulates the response signal by the modulating unit 63 and transmits the modulated response signal from the secondary antenna unit 60. The contactless communication device 40 receives the response signal by the primary antenna unit 20a and demodulates the received signal by the demodulating unit 23. Based on the demodulated contents, the contactless communication device 40 performs necessary processing by the system control unit 21.

5. Exemplary Contactless Charging Device

The resonant circuit 20 using the variable capacitance circuit 1 according to the present disclosure may be incorporated into a contactless charging device 80 configured to contactlessly charge a secondary battery used in a portable terminal such as a mobile phone. Various contactless charging methods such as an electromagnetic induction method and magnetic resonance may be adopted.

Figure 14:
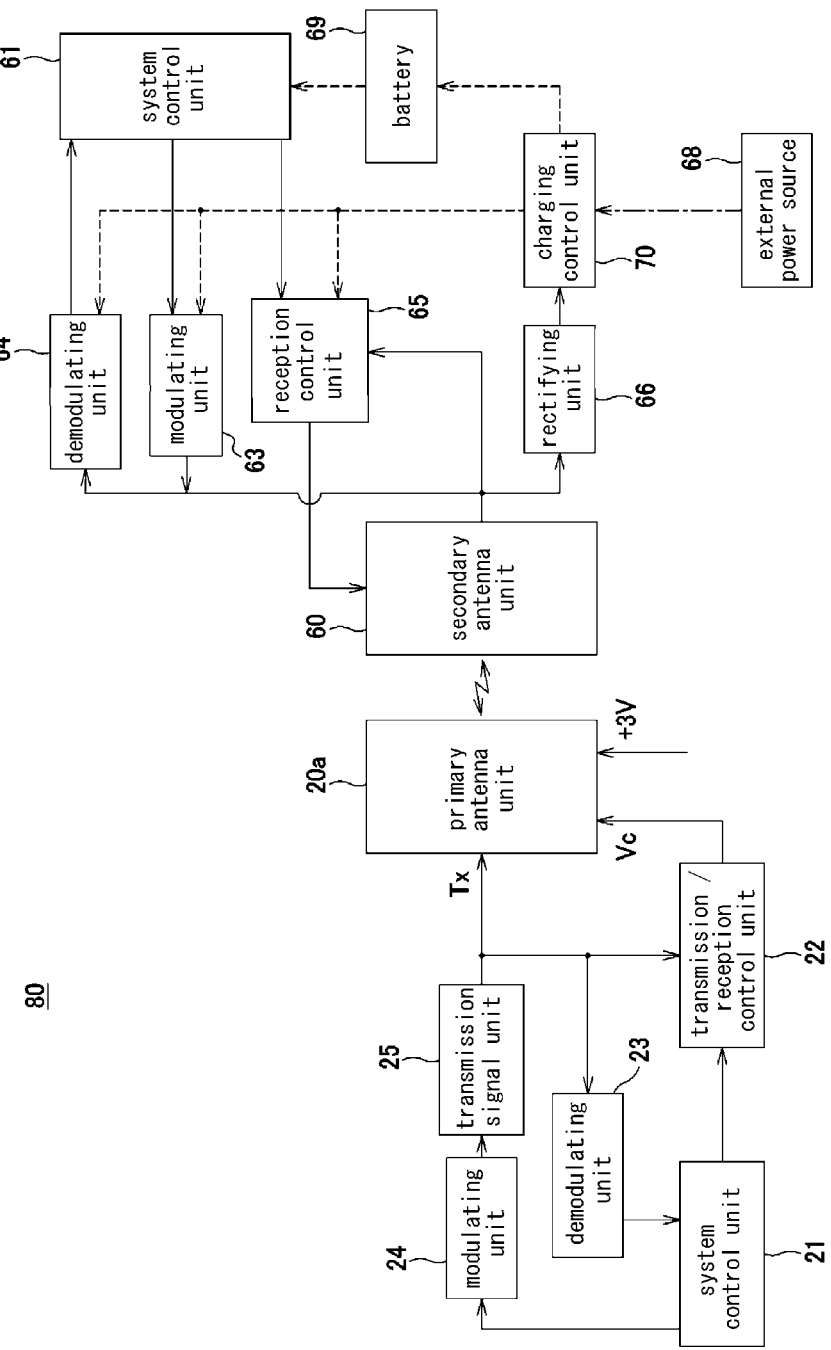
FIG. 14 is a block diagram illustrating an exemplary configuration of a contactless charging system including a contactless charging device according to at least one embodiment of the present disclosure.

FIG. 14 illustrates an exemplary configuration of a contactless charging system that includes the contactless charging device 80 to which the present disclosure is applied and that also includes a power-receiving device, such as a portable terminal, that is charged and controlled by the contactless charging device 80.

The contactless charging device 80 has substantially the same configuration as the aforementioned contactless communication device 40. The power-receiving device also has substantially the same configuration as the aforementioned contactless communication module. Accordingly, the same reference numerals are used to denote the blocks having the same functions as in the contactless communication device 40 and the contactless communication module illustrated in FIG. 9. Herein, although the carrier frequency used for transmission and reception in the contactless communication device 40 is in most cases 13.56 MHz, the carrier frequency used in the contactless charging device 80 may be in the range from 100 kHz to several hundred kHz.

The contactless charging device 80 performs impedance matching with the primary antenna unit 20a based on a carrier signal that the transmission signal unit 25 outpus. The contactless charging device 80 also regulates the resonant frequency of the resonant circuit in accordance with the condition of reception of the receiver, i.e., the contactless communication module.

The transmission/reception control unit 22 controls the variable voltage Vc of the primary antenna unit 20a to achieve the impedance matching by monitoring the transmission voltage and the transmission current of the transmitted carrier signal, for impedance regulation.

The power-receiving device receives the signal by the secondary antenna unit 60 and rectifies the received signal by the rectifying unit 66. The rectified direct current voltage charges the battery 69 under control of a charging control unit 70. Even when no signal is received by the secondary antenna unit 60, the battery 69 may be charged by driving the charging control unit 70 with use of an external power source 68, such as an AC adaptor.

The signal transmitted from the contactless communication device 40 is received by the secondary antenna unit 60, and the received signal is then demodulated by the demodulating unit 64. The contents of the demodulated signal are determined by the system control unit 61, and the system control unit 61 generates a response signal based on a determination result. Additionally, the reception control unit 65 may also regulate the resonant frequency to optimize the condition of reception by regulating the resonant parameters or the like of the secondary antenna unit 60 based on the amplitude, the voltage phase, and the current phase of the received signal.

Thus, when being used in the resonant circuit with the resonant coil, the variable capacitance circuit 1 according to the present disclosure is capable of changing the impedance for the resonant antenna and accordingly, is capable of regulating the antenna current without the need for changing the resonant frequency.

REFERENCE SIGNS LIST

1, 1a variable capacitance circuit
1b, 1c variable capacitance device
2 series variable capacitance element
2a, 2b variable capacitance capacitor
3 main body
3a electrode
4 parallel variable capacitance element
4a, 4b variable capacitance capacitor
6 variable capacitance capacitor
7a to 7c direct current terminal
8a to 8e alternate current terminal
9a, 9b direct current cut-off capacitor
10a to 10j direct current bias resistance
11 amplifier
12 coil
14 filter circuit
15 transmission signal terminal
16a, 16b connection terminal
20 resonant circuit
20a primary antenna unit
21 system control unit
22 transmission/reception control unit
23 demodulating unit
24 modulating unit
25 transmission signal unit
40 contactless communication device
60 secondary antenna unit
61 system control unit
63 modulating unit 64 demodulating unit
65 reception control unit
66 rectifying unit
67 constant voltage unit
68 external power source
69 battery
70 charging control unit
80 contactless charging device

The invention claimed is:

1. A variable capacitance circuit, comprising:
a first variable capacitance element having a first combined capacitance value;
a second variable capacitance element having a second combined capacitance value;
a first to a third alternate current terminal through which alternate current signals are inputted and outputted to and from the first and the second variable capacitance element; and
a first to a third direct current terminal connected to the first and the second variable capacitance element so that direct current voltages are applied to the first and the second variable capacitance element, wherein
the first and the second variable capacitance element are connected in series between the first alternate current terminal and the third alternate current terminal,
the second alternate current terminal is connected to a series connection node between the first variable capacitance element and the second variable capacitance element,
the first variable capacitance element includes at least a first variable capacitance capacitor and a second variable capacitance capacitor connected in series,
the second variable capacitance element includes at least a third variable capacitance capacitor and a fourth variable capacitance capacitor connected in series,
the first direct current terminal connects to a connection node between the first variable capacitance capacitor and the second variable capacitance capacitor,
the second direct current terminal connects to the first alternate current terminal, a connection node between the first variable capacitance element and the second variable capacitance element, and the third alternate current terminal,
the third direct current terminal connects a connection node between the third variable capacitance capacitor and the fourth variable capacitance capacitor,
the first combined capacitance value changes in response to direct current voltages applied to the first and the second direct current terminal,
the second combined capacitance value changes in response to direct current voltages applied to the second and the third direct current terminal, and
the change in the first combined capacitance value and the change in the second combined capacitance value are opposite in direction.

2. The variable capacitance circuit of claim 1, wherein
the direct current voltage applied to the second direct current terminal is an intermediate voltage that varies between the direct current voltage applied to the first direct current terminal and the direct current voltage applied to the third direct current terminal.

3. The variable capacitance circuit of claim 2, wherein
when a direct current voltage between the first direct current terminal and the intermediate voltage is increased, a direct current voltage between the intermediate voltage and the third direct current terminal is reduced, the first combined capacitance value is reduced, and the second combined capacitance value is increased, and
when the direct current voltage between the first direct current terminal and the intermediate voltage is reduced, the direct current voltage between the intermediate voltage and the third direct current terminal is increased, the first combined capacitance value is increased, and the second combined capacitance value is reduced.

4. The variable capacitance circuit of claim 3, wherein
in response to the intermediate voltage being varied, an amount of the change in the first combined capacitance value and an amount of the change in the second combined capacitance value are equal in absolute value.

5. The variable capacitance circuit of claim 4, wherein
the first combined capacitance value is not equal to the second combined capacitance value.

6. The variable capacitance circuit of claim 1, wherein
the direct current voltage applied to the first direct current terminal and the direct current voltage applied to the third direct current terminal each have a fixed value, and
a direct current voltage between the second direct current terminal and the first direct current terminal, or a direct current voltage between the second direct current terminal and the third direct current terminal is a variable control voltage.

7. A variable capacitance circuit, comprising:
a first variable capacitance element having a first combined capacitance value;
a second variable capacitance element having a second combined capacitance value;
a third variable capacitance element having a third combined capacitance value;
a fourth variable capacitance element having a fourth combined capacitance value;
a first to a fifth alternate current terminal through which alternate current signals are inputted and outputted to and from the first to the fourth variable capacitance element; and
a first to a third direct current terminal connected to the first to the fourth variable capacitance element so that direct current voltages are applied to the first to the fourth variable capacitance element, wherein
the first and the second variable capacitance element are connected in series between the first alternate current terminal and the third alternate current terminal, and the second alternate current terminal is connected to a series connection node between the first variable capacitance element and the second variable capacitance element,
the third and the fourth variable capacitance element are connected in series between the fourth alternate current terminal and the third alternate current terminal, and the fifth alternate current terminal is connected to a series connection node between the third variable capacitance element and the fourth variable capacitance element,
the first variable capacitance element includes at least a first variable capacitance capacitor and a second variable capacitance capacitor connected in series,
the second variable capacitance element includes at least a third variable capacitance capacitor and a fourth variable capacitance capacitor connected in series, the third variable capacitance element includes at least a fifth variable capacitance capacitor and a sixth variable capacitance capacitor connected in series, the fourth variable capacitance element includes at least a seventh variable capacitance capacitor and an eighth variable capacitance capacitor connected in series, the first direct current terminal connects to a connection node between the first variable capacitance capacitor and the second variable capacitance capacitor, and a connection node between the fifth variable capacitance capacitor and the sixth variable capacitance capacitor, the second direct current terminal connects to the first to the fourth alternate current terminal, and the third direct current terminal connects to a connection node between the third variable capacitance capacitor and the fourth variable capacitance capacitor, and a connection node between the seventh variable capacitance capacitor and the eighth variable capacitance capacitor, the first and the third combined capacitance value each change in response to direct current voltages applied to the first and the second direct current terminal, the second and the fourth combined capacitance value each change in response to direct current voltages applied to the second and the third direct current terminal, the first combined capacitance value is equal to the third combined capacitance value, the second combined capacitance value is equal to the fourth combined capacitance value, the change in the first combined capacitance value and the change in the second combined capacitance value are opposite in direction, and the change in the third combined capacitance value and the change in the fourth combined capacitance value are opposite in direction.

8. A variable capacitance device, comprising:

a first variable capacitance element having a first combined capacitance value;

a second variable capacitance element having a second combined capacitance value;

a first to a third alternate current terminal through which alternate current signals are inputted and outputted to and from the first and the second variable capacitance element; and a first to a third direct current terminal connected to the first and the second variable capacitance element so that direct current voltages are applied to the first and the second variable capacitance element, wherein the first and the second variable capacitance element are connected in series between the first alternate current terminal and the third alternate current terminal, the second alternate current terminal is connected to a series connection node between the first variable capacitance element and the second variable capacitance element, the first variable capacitance element includes at least a first variable capacitance capacitor and a second variable capacitance capacitor connected in series, the second variable capacitance element includes at least a third variable capacitance capacitor and a fourth variable capacitance capacitor connected in series, the first direct current terminal connects to a connection node between the first variable capacitance capacitor and the second variable capacitance capacitor, the second direct current terminal connects to the first alternate current terminal, a connection node between the first variable capacitance element and the second variable capacitance element, and the third alternate current terminal, the third direct current terminal connects a connection node between the third variable capacitance capacitor and the fourth variable capacitance capacitor, the first combined capacitance value changes in response to direct current voltages applied to the first and the second direct current terminal, the second combined capacitance value changes in response to direct current voltages applied to the second and the third direct current terminal, and the change in the first combined capacitance value and the change in the second combined capacitance value are opposite in direction.

9. The variable capacitance device of claim 8, wherein the direct current voltage applied to the second direct current terminal is an intermediate voltage that varies between the direct current voltage applied to the first direct current terminal and the direct current voltage applied to the third direct current terminal.

10. The variable capacitance device of claim 9, wherein when a direct current voltage between the first direct current terminal and the intermediate voltage is increased, a direct current voltage between the intermediate voltage and the third direct current terminal is reduced, the first combined capacitance value is reduced, and the second combined capacitance value is increased, and when the direct current voltage between the first direct current terminal and the intermediate voltage is reduced, the direct current voltage between the intermediate voltage and the third direct current terminal is increased, the first combined capacitance value is increased, and the second combined capacitance value is reduced.

11. The variable capacitance device of claim 10, wherein in response to the intermediate voltage being varied, an amount of the change in the first combined capacitance value and an amount of the change in the second combined capacitance value are equal in absolute value.

12. The variable capacitance device of claim 11, wherein the first combined capacitance value is not equal to the second combined capacitance value.

13. The variable capacitance device of claim 8, wherein the direct current voltage applied to the first direct current terminal and the direct current voltage applied to the third direct current terminal each have a fixed value, and a direct current voltage between the second direct current terminal and the first direct current terminal, or a direct current voltage between the second direct current terminal and the third direct current terminal is a variable control voltage.

14. A variable capacitance device, comprising:

a first variable capacitance element having a first combined capacitance value;

a second variable capacitance element having a second combined capacitance value;

a third variable capacitance element having a third combined capacitance value;

a fourth variable capacitance element having a fourth combined capacitance value;

a first to a fifth alternate current terminal through which alternate current signals are inputted and outputted to and from the first to the fourth variable capacitance element; and a first to a third direct current terminal connected to the first to the fourth variable capacitance element so that direct current voltages are applied to the first to the fourth variable capacitance element, wherein the first and the second variable capacitance element are connected in series between the first alternate current terminal and the third alternate current terminal, and the second alternate current terminal is connected to a series connection node between the first variable capacitance element and the second variable capacitance element, the third and the fourth variable capacitance element are connected in series between the fourth alternate current terminal and the third alternate current terminal, and the fifth alternate current terminal is connected to a series connection node between the third variable capacitance element and the fourth variable capacitance element, the first variable capacitance element includes at least a first variable capacitance capacitor and a second variable capacitance capacitor connected in series, the second variable capacitance element includes at least a third variable capacitance capacitor and a fourth variable capacitance capacitor connected in series, the third variable capacitance element includes at least a fifth variable capacitance capacitor and a sixth variable capacitance capacitor connected in series, the fourth variable capacitance element includes at least a seventh variable capacitance capacitor and an eighth variable capacitance capacitor connected in series, the first direct current terminal connects to a connection node between the first variable capacitance capacitor and the second variable capacitance capacitor, and a connection node between the fifth variable capacitance capacitor and the sixth variable capacitance capacitor, the second direct current terminal connects to the first to the fourth alternate current terminal, the third direct current terminal connects to a connection node between the third variable capacitance capacitor and the fourth variable capacitance capacitor, and a connection node between the seventh variable capacitance capacitor and the eighth variable capacitance capacitor, the first and the third combined capacitance value each change in response to direct current voltages applied to the first and the second direct current terminal, the second and the fourth combined capacitance value each change in response to direct current voltages applied to the second and the third direct current terminal, the first combined capacitance value is equal to the third combined capacitance value, the second combined capacitance value is equal to the fourth combined capacitance value, the change in the first combined capacitance value and the change in the second combined capacitance value are opposite in direction, and the change in the third combined capacitance value and the change in the fourth combined capacitance value are opposite in direction.

15. A resonant circuit, comprising:

a variable capacitance circuit that comprises a first variable capacitance element having a first combined capacitance value, a second variable capacitance element having a second combined capacitance value, a first to a third alternate current terminal through which alternate current signals are inputted and outputted to and from the first and the second variable capacitance element, and a first to a third direct current terminal connected to the first and the second variable capacitance element so that direct current voltages are applied to the first and the second variable capacitance element; and a coil connected to the variable capacitance circuit, wherein in the variable capacitance circuit, the first and the second variable capacitance element are connected in series between the first alternate current terminal and the third alternate current terminal, the second alternate current terminal is connected to a series connection node between the first variable capacitance element and the second variable capacitance element, the first variable capacitance element includes at least a first variable capacitance capacitor and a second variable capacitance capacitor connected in series, the second variable capacitance element includes at least a third variable capacitance capacitor and a fourth variable capacitance capacitor connected in series, the first direct current terminal connects to a connection node between the first variable capacitance capacitor and the second variable capacitance capacitor, the second direct current terminal connects to the first alternate current terminal, a connection node between the first variable capacitance element and the second variable capacitance element, and the third alternate current terminal, the third direct current terminal connects a connection node between the third variable capacitance capacitor and the fourth variable capacitance capacitor, the first combined capacitance value changes in response to direct current voltages applied to the first and the second direct current terminal, and the second combined capacitance value changes in response to direct current voltages applied to the second and the third direct current terminal, and the change in the first combined capacitance value and the change in the second combined capacitance value are opposite in direction.

16. The resonant circuit of claim 15, wherein the direct current voltage applied to the second direct current terminal is an intermediate voltage that varies between the direct current voltage applied to the first direct current terminal and the direct current voltage applied to the third direct current terminal.

17. The resonant circuit of claim 16, wherein when a direct current voltage between the first direct current terminal and the intermediate voltage is increased, a direct current voltage between the intermediate voltage and the third direct current terminal is reduced, the first combined capacitance value is reduced, and the second combined capacitance value is increased, and when the direct current voltage between the first direct current terminal and the intermediate voltage is reduced, the direct current voltage between the intermediate voltage and the third direct current terminal is increased, the first combined capacitance value is increased, and the second combined capacitance value is reduced.

18. The resonant circuit of claim 17, wherein
in response to the intermediate voltage being varied, an amount of the change in the first combined capacitance value and an amount of the change in the second combined capacitance value are equal in absolute value.

19. The resonant circuit of claim 18, wherein
the first combined capacitance value is not equal to the second combined capacitance value.

20. The resonant circuit of claim 15, wherein
the direct current voltage applied to the first direct current terminal and the direct current voltage applied to the third direct current terminal each have a fixed value, and
a direct current voltage between the second direct current terminal and the first direct current terminal, or a direct current voltage between the second direct current terminal and the third direct current terminal is a variable control voltage.

21. A resonant circuit, comprising:
a variable capacitance circuit that comprises a first variable capacitance element having a first combined capacitance value, a second variable capacitance element having a second combined capacitance value, a third variable capacitance element having a third combined capacitance value, a fourth variable capacitance element having a fourth combined capacitance value, a first to a fifth alternate current terminal through which alternate current signals are inputted and outputted to and from the first to the fourth variable capacitance element, and a first to a third direct current terminal connected to the first to the fourth variable capacitance element so that direct current voltages are applied to the first to the fourth variable capacitance element; and
a coil connected to the variable capacitance circuit, wherein
in the variable capacitance circuit, the first and the second variable capacitance element are connected in series between the first alternate current terminal and the third alternate current terminal, and the second alternate current terminal is connected to a series connection node between the first variable capacitance element and the second variable capacitance element,
the third and the fourth variable capacitance element are connected in series between the fourth alternate current terminal and the third alternate current terminal, and the fifth alternate current terminal is connected to a series connection node between the third variable capacitance element and the fourth variable capacitance element,
the first variable capacitance element includes at least a first variable capacitance capacitor and a second variable capacitance capacitor connected in series,
the second variable capacitance element includes at least a third variable capacitance capacitor and a fourth variable capacitance capacitor connected in series,
the third variable capacitance element includes at least a fifth variable capacitance capacitor and a sixth variable capacitance capacitor connected in series,
the fourth variable capacitance element includes at least a seventh variable capacitance capacitor and an eighth variable capacitance capacitor connected in series,
the first direct current terminal connects to a connection node between the first variable capacitance capacitor and the second variable capacitance capacitor, and a connection node between the fifth variable capacitance capacitor and the sixth variable capacitance capacitor,
the second direct current terminal connects to the first to the fourth alternate current terminal, and
the third direct current terminal connects to a connection node between the third variable capacitance capacitor and the fourth variable capacitance capacitor, and a connection node between the seventh variable capacitance capacitor and the eighth variable capacitance capacitor,
the coil has one end that is connected to the second alternate current terminal and another end that is connected to the fifth alternate current terminal,
the first and the third combined capacitance value each change in response to direct current voltages applied to the first and the second direct current terminal,
the second and the fourth combined capacitance value each change in response to direct current voltages applied to the second and the third direct current terminal,
the first combined capacitance value is equal to the third combined capacitance value,
the second combined capacitance value is equal to the fourth combined capacitance value,
the change in the first combined capacitance value and the change in the second combined capacitance value are opposite in direction, and
the change in the third combined capacitance value and the change in the fourth combined capacitance value are opposite in direction.

22. An amplifying circuit, comprising:
a variable capacitance circuit that comprises a first variable capacitance element having a first combined capacitance value, a second variable capacitance element having a second combined capacitance value, a first to a third alternate current terminal through which alternate current signals are inputted and outputted to and from the first and the second variable capacitance element, and a first to a third direct current terminal connected to the first and the second variable capacitance element so that direct current voltages are applied to the first and the second variable capacitance element; and
an amplifier connected to the variable capacitance circuit, wherein
the first and the second variable capacitance element are connected in series between the first alternate current terminal and the third alternate current terminal, and the second alternate current terminal is connected to a series connection node between the first variable capacitance element and the second variable capacitance element,
the first variable capacitance element includes at least a first variable capacitance capacitor and a second variable capacitance capacitor connected in series,
the second variable capacitance element includes at least a third variable capacitance capacitor and a fourth variable capacitance capacitor connected in series,
the first direct current terminal connects to a connection node between the first variable capacitance capacitor and the second variable capacitance capacitor,
the second direct current terminal connects to the first alternate current terminal, a connection node between the first variable capacitance element and the second variable capacitance element, and the third alternate current terminal,
the third direct current terminal connects a connection node between the third variable capacitance capacitor and the fourth variable capacitance capacitor, the amplifier has an input that is connected to the second alternate current terminal, the first combined capacitance value changes in response to direct current voltages applied to the first and the second direct current terminal, the second combined capacitance value changes in response to direct current voltages applied to the second and the third direct current terminal, and the change in the first combined capacitance value and the change in the second combined capacitance value are opposite in direction.

23. An electronic apparatus, comprising:

a variable capacitance circuit that comprises a first variable capacitance element having a first combined capacitance value, a second variable capacitance element having a second combined capacitance value, a first to a third alternate current terminal through which alternate current signals are inputted and outputted to and from the first and the second variable capacitance element, and a first to a third direct current terminal connected to the first and the second variable capacitance element so that direct current voltages are applied to the first and the second variable capacitance element, wherein in the variable capacitance circuit, the first and the second variable capacitance element are connected in series between the first alternate current terminal and the third alternate current terminal, and the second alternate current terminal is connected to a series connection node between the first variable capacitance element and the second variable capacitance element, the first variable capacitance element includes at least a first variable capacitance capacitor and a second variable capacitance capacitor connected in series, the second variable capacitance element includes at least a third variable capacitance capacitor and a fourth variable capacitance capacitor connected in series, the first direct current terminal connects to a connection node between the first variable capacitance capacitor and the second variable capacitance capacitor, the second direct current terminal connects to the first alternate current terminal, a connection node between the first variable capacitance element and the second variable capacitance element, and the third alternate current terminal, the third direct current terminal connects a connection node between the third variable capacitance capacitor and the fourth variable capacitance capacitor, the first combined capacitance value changes in response to direct current voltages applied to the first and the second direct current terminal, and the second combined capacitance value changes in response to direct current voltages applied to the second and the third direct current terminal, and the change in the first combined capacitance value and the change in the second combined capacitance value are opposite in direction.

24. An electronic apparatus, comprising:

a variable capacitance circuit that comprises a first variable capacitance element having a first combined capacitance value, a second variable capacitance element having a second combined capacitance value, a third variable capacitance element having a third combined capacitance value, a fourth variable capacitance element having a fourth combined capacitance value, a first to a fifth alternate current terminal through which alternate current signals are inputted and outputted to and from the first to the fourth variable capacitance element, and a first to a third direct current terminal connected to the first to the fourth variable capacitance element so that direct current voltages are applied to the first to the fourth variable capacitance element, wherein in the variable capacitance circuit, the first and the second variable capacitance element are connected in series between the first alternate current terminal and the third alternate current terminal, the second alternate current terminal is connected to a series connection node between the first variable capacitance element and the second variable capacitance element, the third and the fourth variable capacitance element are connected in series between the fourth alternate current terminal and the third alternate current terminal, and the fifth alternate current terminal is connected to a series connection node between the third variable capacitance element and the fourth variable capacitance element, the first variable capacitance element includes at least a first variable capacitance capacitor and a second variable capacitance capacitor connected in series, the second variable capacitance element includes at least a third variable capacitance capacitor and a fourth variable capacitance capacitor connected in series, the third variable capacitance element includes at least a fifth variable capacitance capacitor and a sixth variable capacitance capacitor connected in series, the fourth variable capacitance element includes at least a seventh variable capacitance capacitor and an eighth variable capacitance capacitor connected in series, the first direct current terminal connects to a connection node between the first variable capacitance capacitor and the second variable capacitance capacitor, and a connection node between the fifth variable capacitance capacitor and the sixth variable capacitance capacitor, the second direct current terminal connects to the first to the fourth alternate current terminal, and the third direct current terminal connects to a connection node between the third variable capacitance capacitor and the fourth variable capacitance capacitor, and a connection node between the seventh variable capacitance capacitor and the eighth variable capacitance capacitor, the first and the third combined capacitance value each change in response to direct current voltages applied to the first and the second direct current terminal, the second and the fourth combined capacitance value each change in response to direct current voltages applied to the second and the third direct current terminal, the first combined capacitance value is equal to the third combined capacitance value, the second combined capacitance value is equal to the fourth combined capacitance value, the change in the first combined capacitance value and the change in the second combined capacitance value are opposite in direction, and the change in the third combined capacitance value and the change in the fourth combined capacitance value are opposite in direction.

25. A variable capacitance circuit, comprising:

a first variable capacitance element having a first combined capacitance value;

a second variable capacitance element having a second combined capacitance value;

a first to a third alternate current terminal through which alternate current signals are inputted and outputted to and from the first and the second variable capacitance element; and a first to a third direct current terminal connected to the first and the second variable capacitance element so that direct current voltages are applied to the first and the second variable capacitance element, wherein the first and the second variable capacitance element are connected in series between the first alternate current terminal and the third alternate current terminal, the second alternate current terminal is connected to a series connection node between the first variable capacitance element and the second variable capacitance element, the first variable capacitance element includes a first variable capacitance capacitor, the second variable capacitance element includes at least a second variable capacitance capacitor and a third variable capacitance capacitor connected in series, the first direct current terminal connects to a connection node between the second variable capacitance capacitor and the third variable capacitance capacitor, the second direct current terminal connects to the third alternate current terminal, and a connection node between the first variable capacitance element and the second variable capacitance element, the third direct current terminal connects the first alternate current terminal, the first combined capacitance value changes in response to direct current voltages applied to the first and the second direct current terminal, the second combined capacitance value changes in response to direct current voltages applied to the second and the third direct current terminal, and the change in the first combined capacitance value and the change in the second combined capacitance value are opposite in direction.

\* \* \* \* \*